US008536504B2

(12) United States Patent
Kats et al.

(10) Patent No.: US 8,536,504 B2
(45) Date of Patent: *Sep. 17, 2013

(54) TERRESTRIAL SOLAR TRACKING PHOTOVOLTAIC ARRAY WITH CHAIN DRIVE

(75) Inventors: Mikhail Kats, Rockaway, NJ (US); Gary D. Hering, Belle Mead, NJ (US); Peter Allen Zawadzki, Clinton, NJ (US); James Sherman, Hillsborough, NJ (US)

(73) Assignee: Suncore Photovoltaics, Inc., Irwindale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/362,530

(22) Filed: Jan. 31, 2012

(65) Prior Publication Data
US 2012/0160991 A1 Jun. 28, 2012

Related U.S. Application Data

(63) Continuation-in-part of application No. 12/478,567, filed on Jun. 4, 2009, now Pat. No. 8,188,415, which is a continuation of application No. 12/257,670, filed on Oct. 24, 2008, now Pat. No. 8,188,413.

(51) Int. Cl.
*G01C 21/02* (2006.01)
*F24J 2/38* (2006.01)
*H01L 31/042* (2006.01)

(52) U.S. Cl.
USPC .................. 250/203.4; 126/605; 136/246

(58) Field of Classification Search
USPC .............. 250/203.4; 126/571–573, 569, 600, 126/698–701; 136/214, 215, 230, 244, 252
See application file for complete search history.

(56) References Cited

U.S. PATENT DOCUMENTS

| 4,031,385 A | 6/1977 | Zerlaut et al. |
| 4,133,501 A | 1/1979 | Pentlicki |

(Continued)

FOREIGN PATENT DOCUMENTS

| DE | 10 2004 01815 A1 | 10/2005 |
| DE | 20 2006 00347 U1 | 12/2006 |

(Continued)

OTHER PUBLICATIONS

U.S. Appl. No. 12/828,734, filed Jul. 1, 2010, Kozin.

(Continued)

*Primary Examiner* — Georgia Y Epps
*Assistant Examiner* — Don Williams
(74) *Attorney, Agent, or Firm* — Mueting, Raasch & Gebhardt, P.A.

(57) ABSTRACT

The terrestrial solar tracking photovoltaic array includes a longitudinal support that may be constructed of discrete sections. The overall length of the array may be adjusted depending upon the necessary size of the array. A drive may be configured to rotate the longitudinal support in first and second directions about a first axis. Solar cell modules are positioned along the longitudinal support and may each include a rectangular case with a plurality of lenses that are positioned over corresponding receivers. Linkages may be connected to the solar cell modules and are axially movable along the longitudinal support to rotate the solar cell modules within second planes that each orthogonal to the first plane to further track the sun during the course of the day. The array may be configured to facilitate rotation about the first axis. The array may be constructed with a center of gravity of the array to extending through the longitudinal support.

20 Claims, 24 Drawing Sheets

(56) References Cited

U.S. PATENT DOCUMENTS

| | | | |
|---|---|---|---|
| 4,172,739 A | 10/1979 | Tassen | |
| 4,345,582 A | 8/1982 | Aharon | |
| 4,425,904 A | 1/1984 | Butler | |
| 4,440,465 A | 4/1984 | Elliott et al. | |
| 4,585,318 A | 4/1986 | Seifert | |
| 4,586,488 A | 5/1986 | Noto | |
| 4,628,142 A | 12/1986 | Hashizume | |
| 4,832,001 A | 5/1989 | Baer | |
| 4,989,124 A | 1/1991 | Shappell | |
| 4,995,377 A | 2/1991 | Eiden | |
| 5,169,456 A | 12/1992 | Johnson | |
| 5,600,124 A | 2/1997 | Berger | |
| 5,798,517 A | 8/1998 | Berger | |
| 6,005,236 A | 12/1999 | Phelan et al. | |
| 6,058,930 A | 5/2000 | Shingleton | |
| 6,079,408 A | 6/2000 | Fukuda | |
| 6,123,067 A | 9/2000 | Warrick | |
| 6,465,725 B1 | 10/2002 | Shibata et al. | |
| 6,552,257 B1 | 4/2003 | Hart et al. | |
| 6,563,040 B2 | 5/2003 | Hayden et al. | |
| 6,722,357 B2 | 4/2004 | Shingleton | |
| 6,960,717 B2 | 11/2005 | Stuart et al. | |
| 7,252,084 B2 | 8/2007 | Pawlenko et al. | |
| 7,381,886 B1 | 6/2008 | Aiken et al. | |
| 7,531,741 B1 | 5/2009 | Melton et al. | |
| 7,795,568 B2 | 9/2010 | Sherman | |
| 7,836,879 B2 | 11/2010 | Mackamul | |
| 7,968,791 B2 | 6/2011 | Do et al. | |
| 8,188,413 B2 | 5/2012 | Sherman et al. | |
| 8,188,415 B2 * | 5/2012 | Kats et al. | 250/203.4 |
| 8,378,281 B2 | 2/2013 | Kats et al. | |
| 2003/0172922 A1 | 9/2003 | Haber | |
| 2004/0112373 A1 | 6/2004 | Djeu | |
| 2007/0089777 A1 | 4/2007 | Johnson, Jr. et al. | |
| 2007/0101738 A1 | 5/2007 | Akei et al. | |
| 2007/0188876 A1 | 8/2007 | Hines et al. | |
| 2007/0193620 A1 | 8/2007 | Hines et al. | |
| 2008/0029151 A1 | 2/2008 | McGlynn et al. | |
| 2008/0128586 A1 | 6/2008 | Johnson et al. | |
| 2008/0135087 A1 | 6/2008 | Anikara | |
| 2008/0178867 A1 | 7/2008 | DiDomenico | |
| 2008/0236567 A1 | 10/2008 | Hayden | |
| 2008/0258051 A1 | 10/2008 | Heredia et al. | |
| 2009/0000662 A1 | 1/2009 | Harwood et al. | |
| 2009/0032014 A1 | 2/2009 | Meydbray | |
| 2009/0032084 A1 | 2/2009 | Aiken et al. | |
| 2009/0032086 A1 | 2/2009 | Kats et al. | |
| 2009/0032090 A1 | 2/2009 | Kats et al. | |
| 2009/0199890 A1 | 8/2009 | Hering et al. | |
| 2010/0011565 A1 | 1/2010 | Zawadzki et al. | |
| 2010/0018570 A1 | 1/2010 | Cashion et al. | |
| 2010/0032004 A1 | 2/2010 | Baker et al. | |
| 2010/0101625 A1 | 4/2010 | Kats et al. | |
| 2010/0101630 A1 | 4/2010 | Kats et al. | |
| 2010/0101632 A1 | 4/2010 | Kats et al. | |
| 2010/0102200 A1 | 4/2010 | Kats et al. | |
| 2010/0102202 A1 | 4/2010 | Sherman | |
| 2010/0108860 A1 | 5/2010 | Sherman et al. | |
| 2010/0258110 A1 | 10/2010 | Krabbe et al. | |
| 2010/0294337 A1 | 11/2010 | Sherman et al. | |
| 2011/0289750 A1 | 12/2011 | Kats et al. | |

FOREIGN PATENT DOCUMENTS

| | | |
|---|---|---|
| ES | 2268938 A1 | 3/2007 |
| JP | 2000196127 | 7/2000 |
| JP | 2000223730 | 8/2000 |
| JP | 2002202817 | 7/2002 |
| WO | WO 0155651 A1 | 8/2001 |
| WO | WO 02/079793 | 10/2002 |
| WO | WO 2008/008023 | 1/2008 |
| WO | WO 2008/090241 A1 | 7/2008 |
| WO | WO 2008/154945 | 12/2008 |
| WO | WO 2009/048879 | 4/2009 |

OTHER PUBLICATIONS

U.S. Appl. No. 12/830,926, filed Jul. 6, 2010, Sherman.
U.S. Appl. No. 13/770,805, filed Feb. 19, 2013, Kats et al.
"170 Watt Multi-Purpose Module NEC 2008 Compliant, NE-170UC1" datasheet. Sharp Electronics Corporation, Huntington, CA, 2008 (metadata indicates that the datasheet was created Jul. 12, 2008); 2 pgs.
Concentrating PV module and system developers[#5,] Photon International: The Photovoltaic Magazine, Photon Europe GmbH, Germany, Aug. 2009; pp. 134-137.
"FEiNA SF-4 Mini Tracker" datasheet. Opel Solar™ Inc., www.opelinc.com, Shelton, CT, Nov. 2009; 2 pgs.
"FEiNA SF-9 Dual Axis Tracker" datasheet. Opel Solar™ Inc., www.opelinc.com, Shelton, CT, Nov. 2009; 2 pgs.
"FEiNA SF-20 Dual Axis Tracker" datasheet. Opel Solar™ Inc., www.opelinc.com, Shelton, CT, Nov. 2009; 2 pgs.
Fraas et al., "Start-up of First 100 kW System in Shanghai with 3-Sun PV Mirror Modules," Presented at 4th International Conference on Solar Concentrators for the Generation of Electricity or Hydrogen (ICSC-4), San Lorenzo del Escorial, Spain, Mar. 12-16, 2007. Jxcrystals.com. JX Crystals, Inc., Issaquah, WA; 4 pgs.
Fraas et al., "Test Sites and Testing of 3-Sun Mirror Modules," Presented at IEE 4th World Conference on Photovoltaic Energy Conversion, Waikoloa, Hawaii, May 9, 2006. Jxcrystals.com. JX Crystals, Inc., Issaquah, WA; 4 pgs.
"Globo-welding, Laser welding of plastics—innovative and flexible. The universal processing concept for 3D and continuous applications," Brochure datasheet. http://www.leister.com/uploads/pdf/en/BRO_GLOBO_Welding_dv092006_ENG.pdf.Sep. 2006. Leister Process Technologies. Sarnen, Switzerland. 4 pages.
"Kinematics slewing drives," Product description datasheet [online]. Kinematics Manufacturing, Inc., Phoenix, AZ, 2009, available online [retrieved on Jul. 8, 2009]. Retrieved from the Internet:<URL: www.kinematicsmfg.com/Products/slewing-drives.aspx>; 1 page.
"Laser welding of plastics. Innovative and flexible." Brochure. http://www.leister.corn/uploads/pdf/en/leister_laser_eng.pdf, Sep. 2007. Leister Process Technologies. Kaegiswil, Switzerland. (12 pages).
Luque et al., Ed. Sections 9.8 and 9.9 "High-Efficiency III-V Multijunction Solar Cells," and Chapter 11 "Photovoltaic Concentrators," *Handbook of Photovoltaic Science and Engineering*, John Wiley & Sons, Ltd., Hoboken, NJ, Jul. 7, 2003; 64 pp. ISBN1591247748.
"Mk-ID High Concentration Photovoltaic Panel (HCPV)" datasheet. Opel Solar™ Inc., www.opelinc.com, Shelton, CT, Nov. 2009.; 2 pgs.
"Opel SF-4M Roof Top Tracker" datasheet. Opel Solar™ Inc., www.opelinc.com, Shelton, CT, Nov. 2009.; 2 pgs.
"Opel SF-20 CPV Dual Axis Tracker" datasheet. Opel Solar™ Inc., www.opelinc.com, Shelton, CT, Nov. 2009; 2 pgs.
"Opel TF-800 Single Axis Tracker" datasheet. Opel Solar™ Inc., www.opelinc.com, Shelton, CT, Nov. 2009; 2 pgs.
Photograph of GE Concentrator Array, Circa 1983, Sandia; 1 page.
"Power-Spar PS-140 Solar Concentrator," datasheet. Menova Energy, Inc., Markham, Ontario, Canada, 2009; (metadata indicates that the datasheet was created Jan. 19, 2009); 2 pgs.
"SF-40 H1 Rooftop Tracker" datasheet. Opel Solar™ Inc., www.opelinc.com, Shelton, CT, 2009 Nov.; 2 pgs.
"Shop Sabre, a N.A.S.C.I. Company, 'The Way CNC Was Meant to Be" Laser Product Information datasheet. Shop SABRE, Elko, MN, USA, 2007, available online [earliest known availability: Jun. 13, 2007; retrieved on 2008-06-26]. Retrieved from the Internet<URL:http://www.shopsabre.com/Laser%20Page.html>; 4 pgs.
"Slewing Drives S7b-73m-32ra," datasheet [online]. Kinematics Manufacturing, Inc., Phoenix, AZ, 2009, available online [earliest known availability: Mar. 8, 2009; retrieved on Jul. 8, 2009]. Retrieved from the Internet: <URL:www.kinematicsmfg.com/Products/slewing-drives/SlweingDrivesProducts/Slewing-Drives-S7B-73M-32RA.aspx>; 2 pgs.
"SunCube™ Specifications" datasheet. Green & Gold Energy Pty, Ltd., Glynde, South Australia, Australia, 2009; 4 pgs.
"Sunflower" datasheet. Energy Innovations, Poway, CA, copyright 2003-2010; 2 pgs.

"TF-500 Dual Axis Tracker" datasheet. Opel Solar™ Inc., www.opelinc.com, Shelton, CT, 2009 Nov.; 2 pgs.

"WS T1000" datasheet [online] WS Energia Lda, Oeiras, Portugal, earliest known availability Oct. 20, 2010, available online. Retrieved from the Internet:<URL: http://www.ws-energia.com/np4EN/trackers>; 2 pgs.

"WS T 1600—the world wide connected solar tracker" datasheet [online] WS Energia Lda, Oeiras, Portugal, earliest known availability Oct. 20, 2010, available online. Retrieved from the Internet<URL: http://www.wsenergia.com/np4EN/trackers>; 3 pgs.

"WS T 1600—the world wide connected solar tracker" datasheet [online]. WS Energia Lda, Oeiras, Portugal, earliest known availability Oct. 20, 2010, available online Retrieved from the Internet:<URL: http://www.wsenergia.com/np4EN/trackers>; 2 pgs.

\* cited by examiner

US 8,536,504 B2

TERRESTRIAL SOLAR TRACKING PHOTOVOLTAIC ARRAY WITH CHAIN DRIVE

REFERENCE TO RELATED APPLICATIONS

The present application is a continuation-in-part of U.S. patent application Ser. No. 12/478,567 filed Jun. 4, 2009 now U.S. Pat. No. 8,188,415, which in turn is a continuation-in-part of U.S. patent application Ser. No. 12/257,670 filed Oct. 24, 2008 now U.S. Pat. No. 8,188,413, both applications being herein incorporated by reference in their entirety.

The present application is also related to U.S. patent application Ser. No. 12/574,508 filed Oct. 6, 2009.

BACKGROUND

The present application is directed to a terrestrial solar tracking photovoltaic array and, more particularly, to a modular array with solar cell modules that are simultaneously movable about first and second orthogonal axes to maintain the solar cell modules aligned with the sun.

Terrestrial solar tracking photovoltaic arrays are used for various applications. The arrays are designed for a specific output capacity and cannot be modified in a convenient manner for different capacities. The set capacity of the arrays may vary from being relatively small, such as a few kilowatts, to relatively large in excess of hundreds of kilowatts. The arrays may be installed at various locations that have exposure to the sun for adequate periods of time to produce the required power capacity.

The photovoltaic arrays generally include a frame with one or more solar cell modules in the form of panels. The frame may be adjustable to position the solar cell modules towards the sun. The frame may adjust the position of the solar cell modules throughout the day to ensure they remain directed to the sun to maximize the power capacity.

Many existing photovoltaic arrays include large frames that support the solar cell modules. The size of the frames and installation requirements often result in their costs being substantial. Initially, the frames are moved by large trucks or other like equipment to the installation site. Cranes or other like lifting equipment are necessary to lift the frames from the trucks and position them at the correct location. This installation process often requires a large workforce due to the extensive moving and assembly requirements of mounting the frame and attaching the associated solar cell modules. These prior designs did not allow for a single person or just a few persons to install the frame and solar cell modules.

These prior frames also provide for mounting a predetermined number of solar cell modules. There was no ability to modify the number of solar cell modules to accommodate the specific needs of the array. Particularly, there is no manner of modifying the design out in the field during or after the installation.

SUMMARY

The present application is directed to a terrestrial solar tracking photovoltaic array including:

a longitudinal support constructed from a plurality of discrete sections placed in an end-to-end configuration;

a drive chain operatively connected to the longitudinal support to rotate the longitudinal support about a first axis in first and second rotational directions;

a plurality of mounts connected to the longitudinal support and spaced apart along a length of the longitudinal support for securing the array to a mounting surface;

a plurality of solar cell array modules coupled to the longitudinal support, each of said solar cell modules comprising a rectangular case with a plurality of lenses positioned over corresponding receivers;

a string of linkages spaced apart from the longitudinal support and connecting together each of the plurality of mounts, each of the linkages including a discrete length;

the longitudinal support being rotatable about the first axis by the drive chain to simultaneously move each of the solar cell modules to track the sun within a first plane during the course of a day; and the string of linkages being movable axially along the longitudinal support to rotate each of the plurality of mounts and the connected solar cell modules within second planes that are each orthogonal to the first plane to track the sun during the course of the day.

In another aspect, the present disclosure provides a linear actuator connected to the drive chain to move the drive chain and thereby rotate the longitudinal support by an axial angle in excess of 180°.

In another aspect, the present disclosure provides a frame pivotably connected to the longitudinal support for supporting four solar array modules.

In another aspect, the present disclosure provides linear actuator having a movable shaft having first and second rolling members disposed on opposite sides thereof.

In another aspect, the present disclosure provides the linear actuator being attached to and supported on one of said mounts.

In another aspect, the present disclosure provides that the mount includes a first linear track engaging the first rolling member.

In another aspect, the present disclosure provides that the mount includes a second linear track engaging the second rolling member.

In another aspect, the present disclosure provides that the first linear track is disposed on a first side of the first and second rolling members, and said second linear track is disposed on a second opposite side of the first and second rolling members.

In another aspect, the present disclosure provides that the first and second linear tracks are parallel.

In another aspect, the present disclosure provides that the drive chain functions as an anti-backlash mechanism connected to the longitudinal support to counteract a force acting on the longitudinal support caused by the distribution of mass of the plurality of solar cell modules after the longitudinal support is rotated by the drive beyond a predetermined rotational position.

In another aspect, the present disclosure provides that the drive chain is configured for the linear actuator to apply a constant torque on the longitudinal support during movement in the first rotational direction between a first rotational position at a beginning of a day and a second rotational position at an end of a day.

In another aspect, the present disclosure provides a center of gravity of the array is positioned along the longitudinal support.

In another aspect, the present disclosure provides that the drive chain maintains a constant potential energy level of the array.

In another aspect, the present disclosure provides that the array further comprises a controller operatively connected to the drive and the string of linkages to control rotation of the longitudinal support about the first axis and the axial movement of the string of linkages.

In another aspect, the present disclosure provides the longitudinal support is a pipe with a diameter of about 4 inches with a coaxial first circular sprocket gear for engaging the drive chain, and a second circular sprocket gear mounted on the vertical support also for engaging the drive chain.

In another aspect, the present disclosure provides that the second circular sprocket gear has a smaller diameter than said first circular sprocket gear.

In another aspect, the present disclosure provides that the array further comprises a housing covering at least a portion of the linear actuator and mounted on said one mounted, wherein the interior surface of said housing forms a track for engaging the second rolling member.

In another aspect, the present disclosure provides that the array further comprises a housing covering the first circular sprocket gear.

The various aspects of the various embodiments may be used alone or in any combination, as is desired.

DETAILED DESCRIPTION

Figure 1:
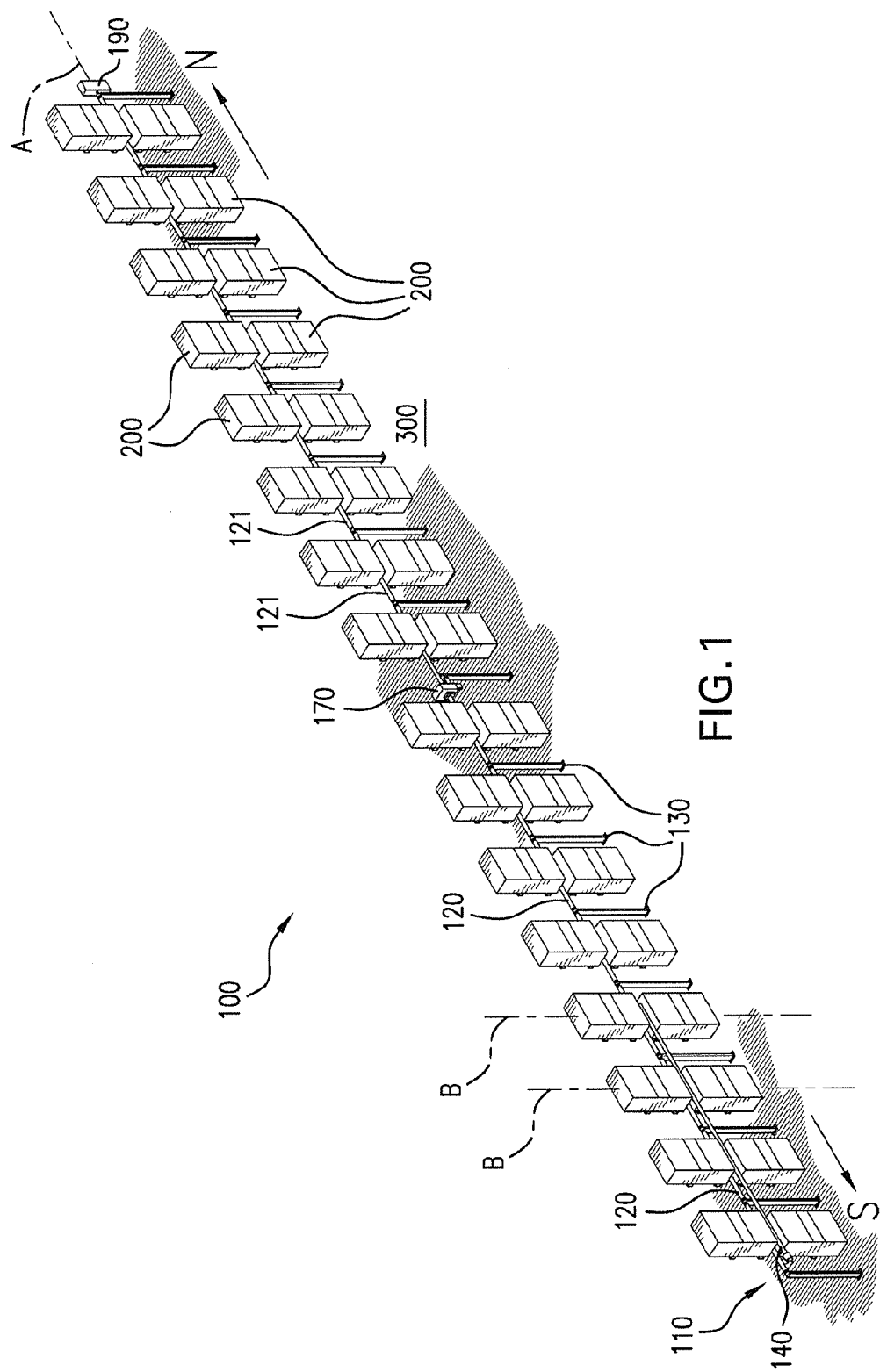
FIG. 1 is a perspective view of a terrestrial solar tracking photovoltaic array according to one embodiment.

The present application is directed to a terrestrial solar tracking photovoltaic array. FIG. 1 illustrates an embodiment of an array generally illustrated as element 100. The array 100 includes an elongated frame 110 configured to mount solar cell modules 200 in a longitudinally-extending and spaced-apart arrangement. The frame 110 is able to rotate each of the solar cell modules 200 along a first axis A to simultaneously track the elevation of the sun during the course of a day. The frame 110 is able to rotate each solar cell module 200 along axes B that are substantially perpendicular to axis A to track the azimuthal position of the sun during the course of the day.

Frame 110 positions the solar cell modules 200 to track the movement of the sun. Frame 110 includes a longitudinal support 120 that is positioned above a surface 300 by spaced-apart vertical supports 130. In one embodiment, the longitudinal support 120 is a single continuous piece. In one specific embodiment, the longitudinal support 120 is a pipe with a diameter of about 4 inches and includes a thickness of about 0.167 inches. The pipe includes a length of about 192" and weighs about 110 lbs.

In another embodiment, the longitudinal support 120 may be constructed from a number of discrete sections 121 that are connected together in an end-to-end arrangement. The lengths and construction of each section 121 may be the same or may be different. In one embodiment, each section 121 is sized to mount a pair or multiple pairs of solar cell array modules 200. The modular design provides for a user to construct the longitudinal support 120 to a length needed to support a necessary number of solar cell modules 200. Sections 121 may be added to an existing frame 110 to accommodate additional solar cell modules 200 as is necessary for the array 100 to produce the desired power output.

Figure 2:
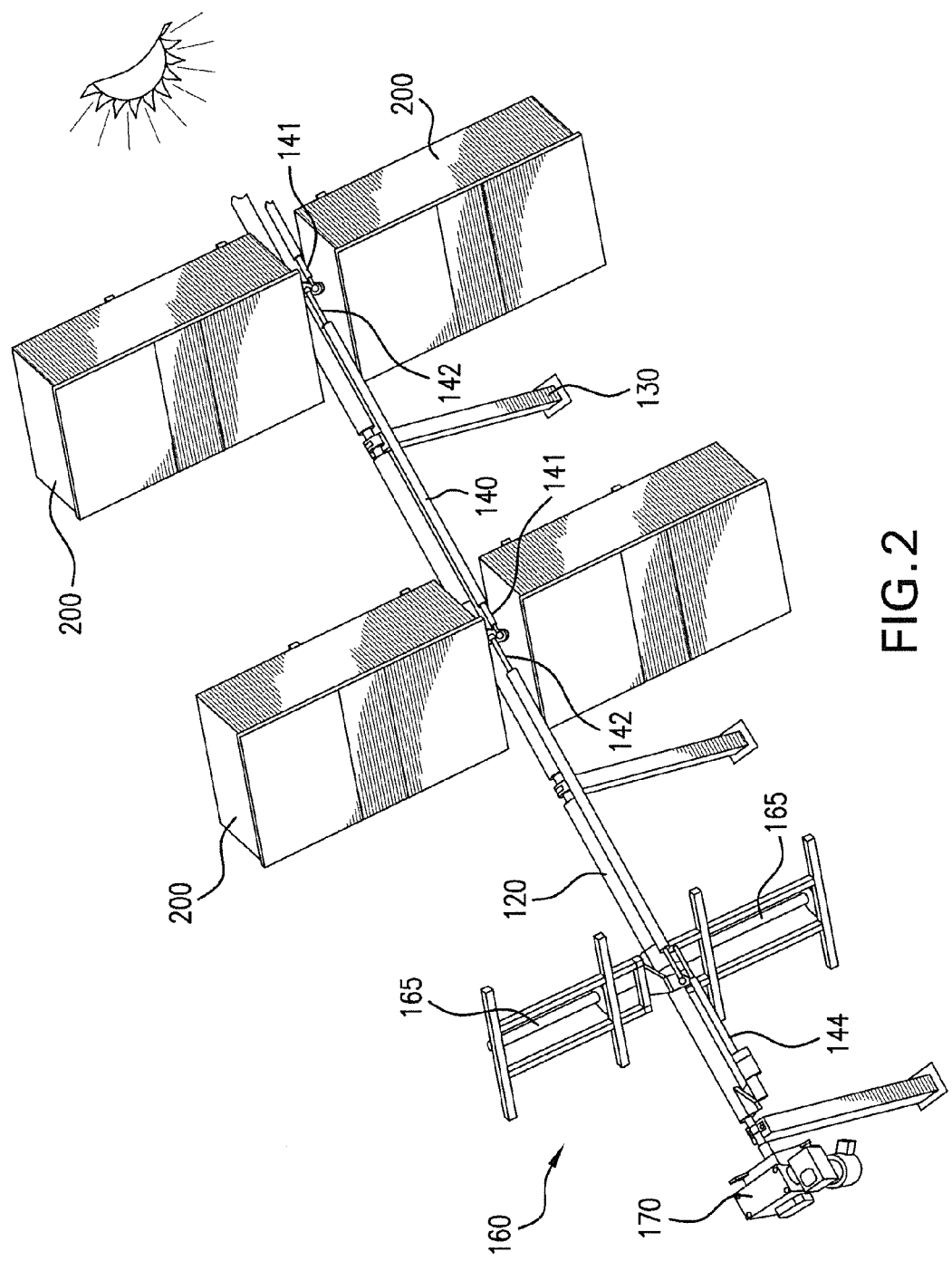
FIG. 2 is a perspective view of a mount and solar cell modules connected to a longitudinal support according to one embodiment.
Figure 3:
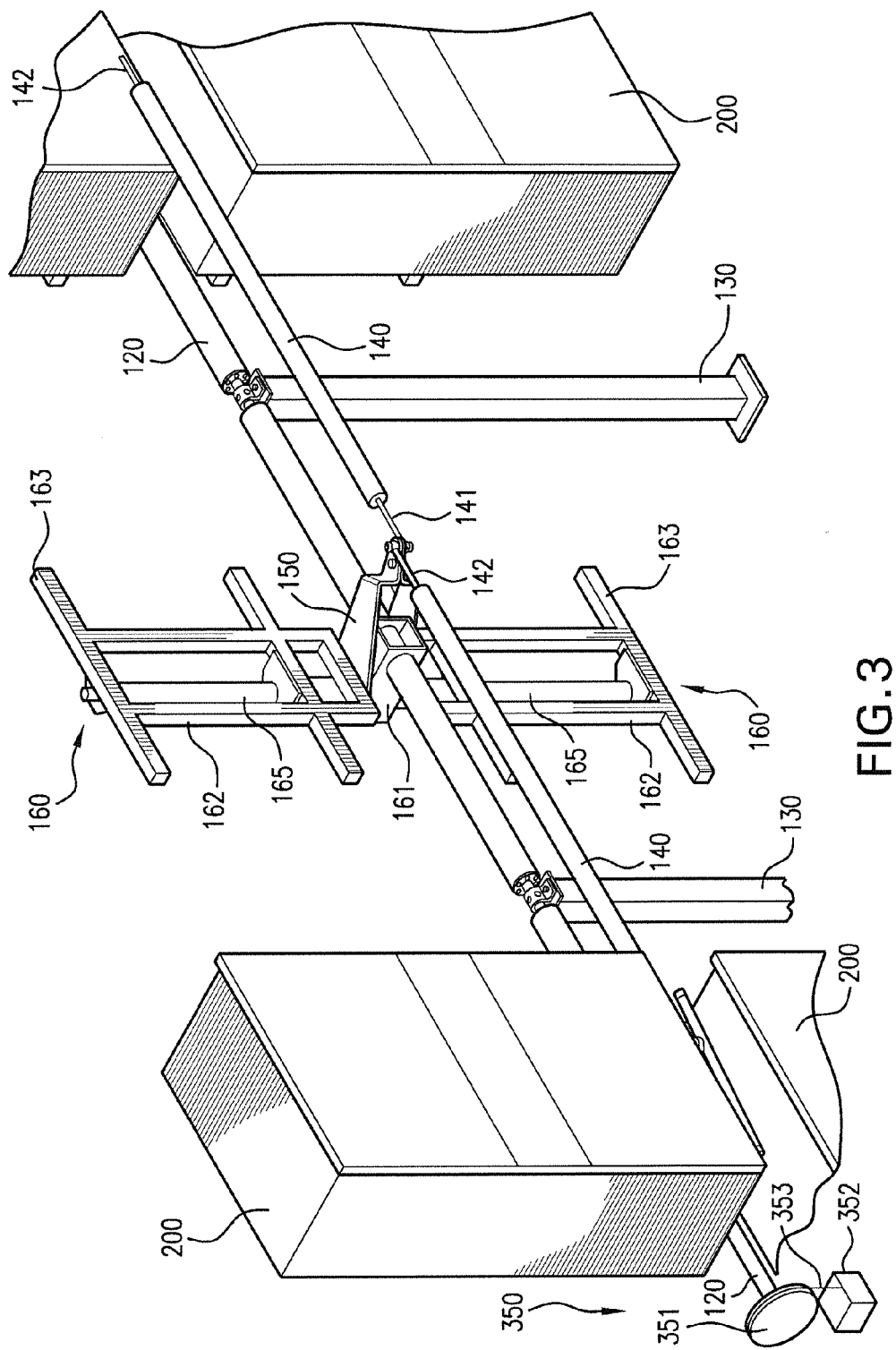
FIG. 3 is a perspective view of a mount connected to a longitudinal support according to one embodiment.
Figure 4:
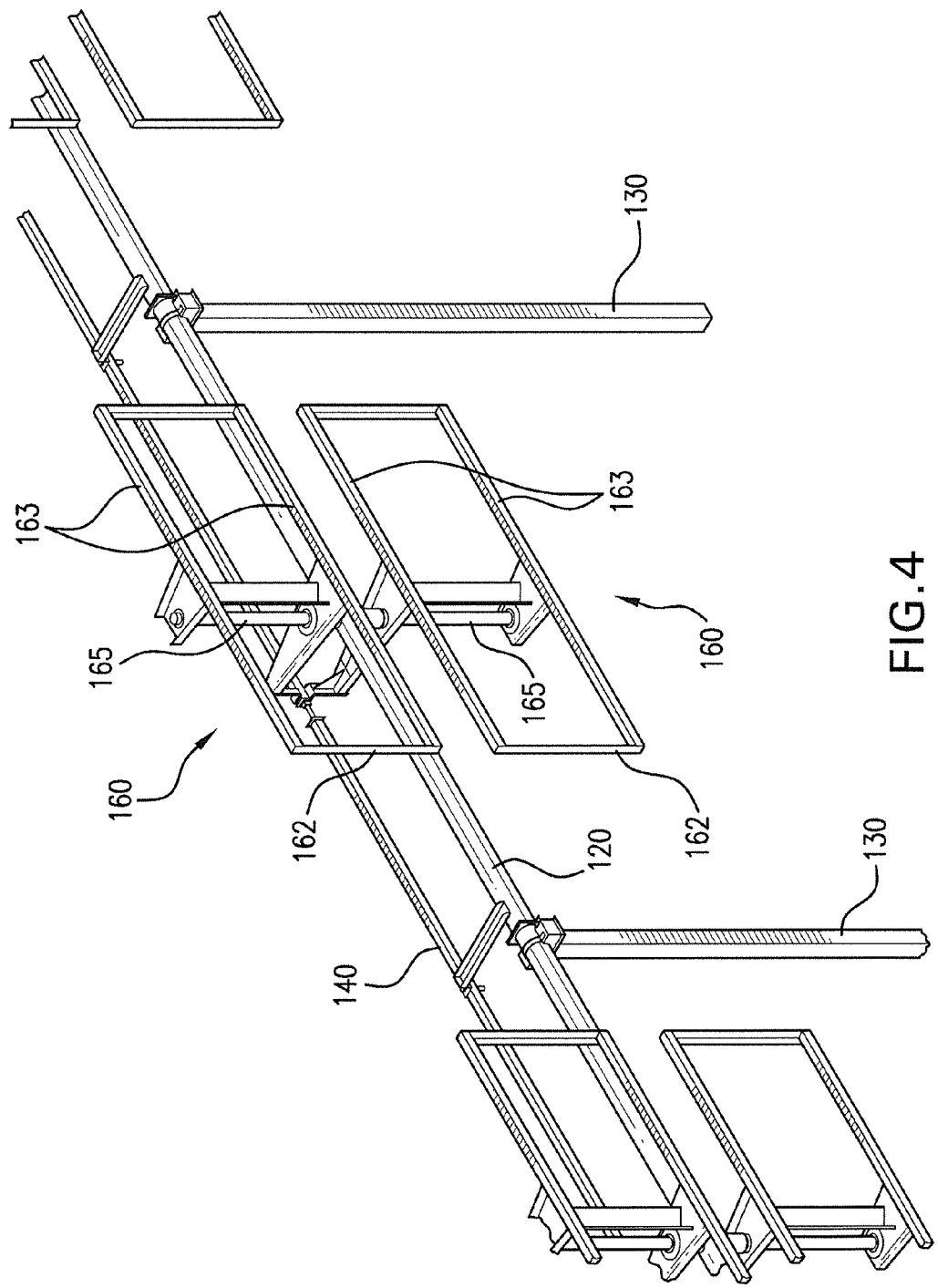
FIG. 4 is a perspective view of a pair of mounts connected to a longitudinal support according to one embodiment.
Figure 5:
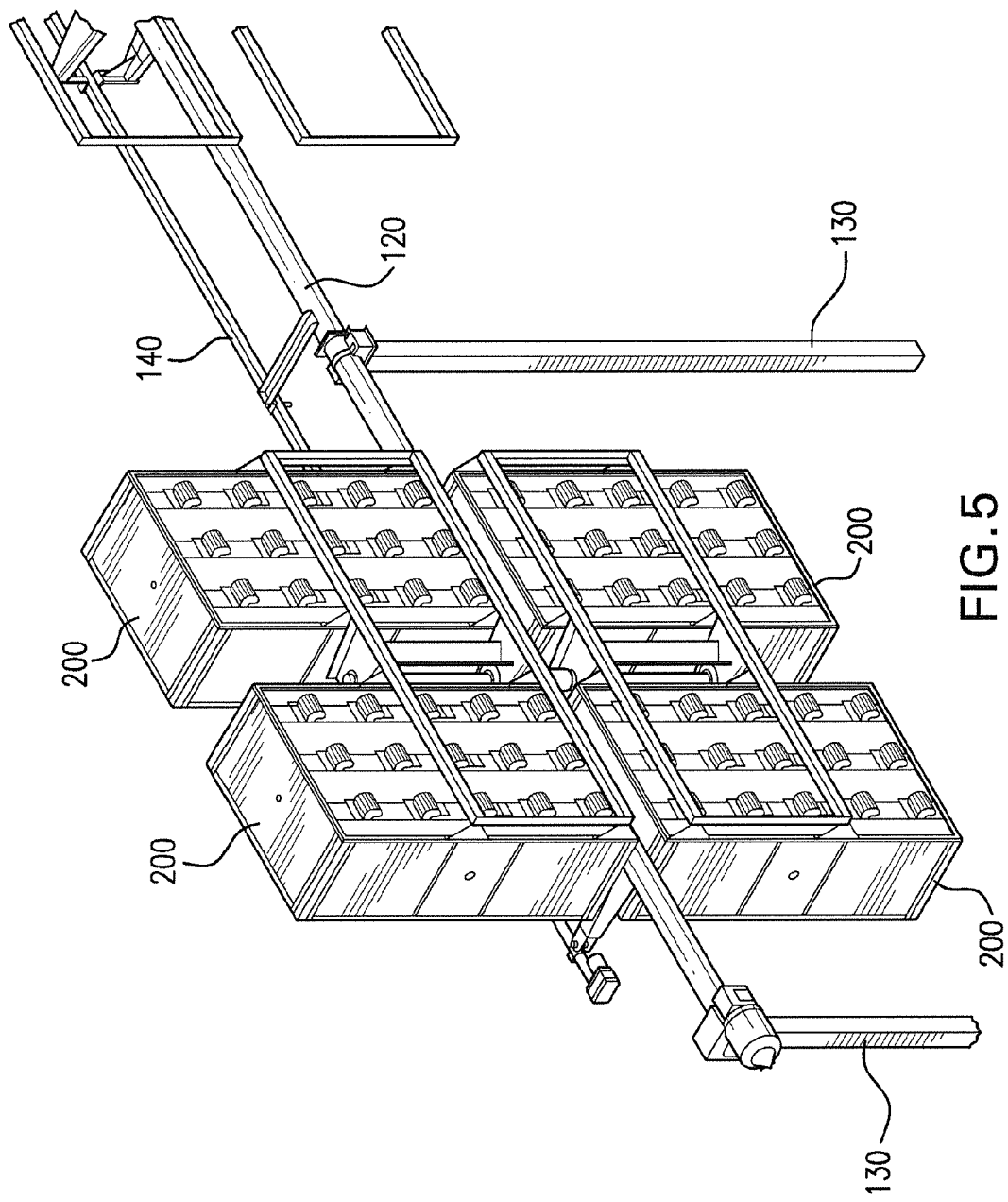
FIG. 5 is a perspective view of mounts and solar cell modules connected to a longitudinal support according to one embodiment.
Figure 6:
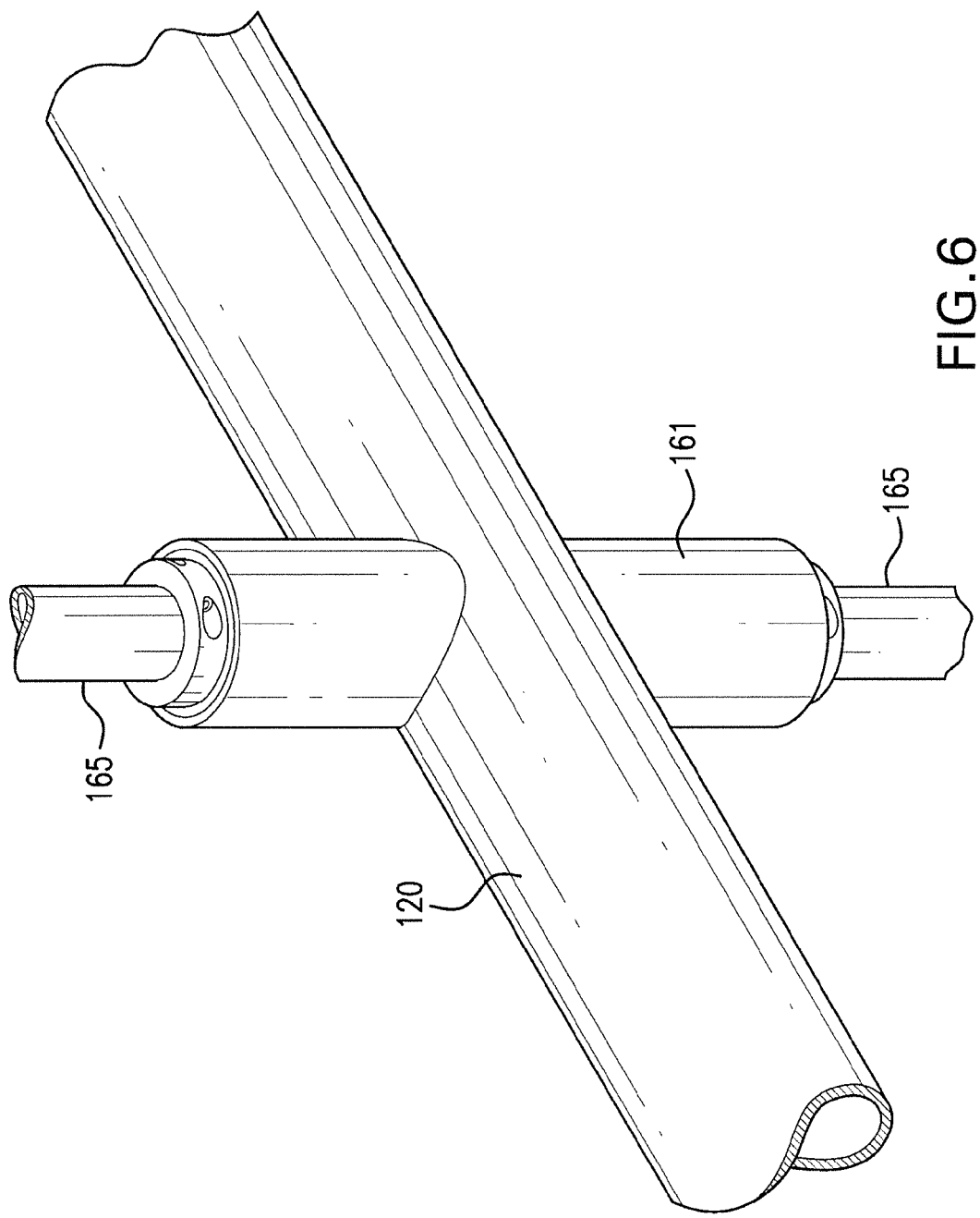
FIG. 6 is a perspective view of a base connected to a longitudinal support according to one embodiment.

Mounts 160 support the solar cell modules 200 and are connected to the longitudinal support 120. Mounts 160 may be connected to the longitudinal support 120 at least in part through a base 161 as best illustrated in FIGS. 3 and 6. The mounts 160 may include vertical members 162 and horizontal members 163 that support the solar cell modules 200. Mounts 160 may be of different sizes to accommodate different numbers of solar cell modules 200. FIGS. 2 and 3 include the mounts 160 sized to each attach to one solar cell module 200. FIGS. 4 and 5 include mounts 160 sized to receive two solar cell modules 200.

Mounts 160 may also include a pivot member 165 that facilitates pivoting motion of the solar cell modules 200 about second axes B as will be explained in detail below. Pivot member 165 may extend through the base 161, or may be located away from the base 161. Further, the pivot member 165 may be a single elongated member or may be constructed of separate members that are positioned in an end-to-end orientation and connected at the base 161.

The mounts 160 may be positioned at various spacings along the length of the longitudinal support 120. FIGS. 2-5 include the mounts 160 aligned along the longitudinal support 120 in offsetting pairs on opposing sides of the longitudinal support 120 directly across from one another. Other offset positioning may include the mounts 160 unevenly spread along the length with equal numbers of mounts 160 extending outward from each opposing side of the longitudinal support 120. The offset positioning assists to balance the array 100 and facilitate rotation about the first axis A. Other configurations may include uneven numbers of mounts 160 extending outward from the opposing sides of the longitudinal support 120.

The vertical supports 130 are spaced apart along the length of the longitudinal support 120. The vertical supports 130 include a length adequate to position the solar cell modules 120 above the surface 300 for rotation about the first axis A. Therefore, the vertical supports 130 are longer than a height of the mounts 160 and the solar cell modules 200.

The vertical supports 130 are positioned along the longitudinal support 120 away from the mounts 160 to prevent interference with the movement of the solar cell modules 200. As illustrated in FIG. 1, the vertical supports 130 are spaced-apart from the solar cell modules 200 along the length of the longitudinal support 120. In this arrangement, the vertical supports 130 are in a non-overlapping arrangement with the solar cell modules 200. Various numbers of vertical supports 130 may be positioned along the length of the longitudinal support 120. In the embodiment of FIG. 1, a vertical support 130 is positioned between each pair of mounts 160. In other embodiments, the vertical supports 130 are spaced a greater distance apart along the longitudinal support 120. In one specific embodiment, the vertical supports 130 include a 4 inch by 4 inch rectangular shape, and include a thickness of about 0.188 inches. The vertical supports 130 may also be supported in a concrete pad.

A drive 170 is connected to the longitudinal support 120 to provide a force to rotate the longitudinal support 120 about axis A. In one embodiment, drive 170 may be positioned at an end of the longitudinal support 120. Drive 170 may include a drive train with one or more gears that engage with the longitudinal support 120. Additional drives 170 may be connected along the length of the longitudinal support 120 to provide additional rotational force.

The drive 170 may also be positioned at an intermediate section of the longitudinal support 120 between the opposing outer ends. This positioning may equalize the torque applied by the drive 170 along the length of the longitudinal support 120.

Figure 7:
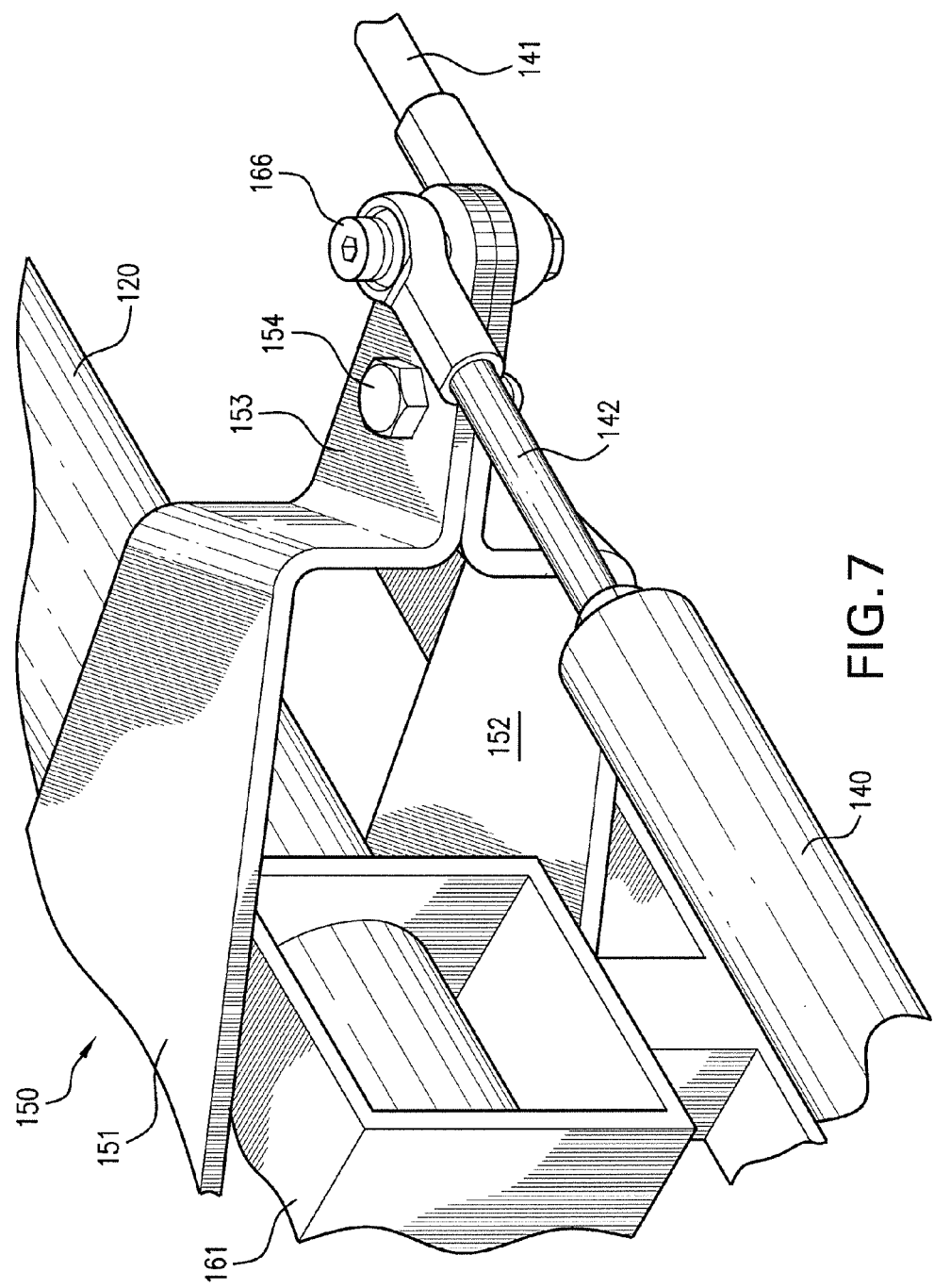
FIG. 7 is a partial perspective view of a linkage and a pivot coupling according to one embodiment.
Figure 8:
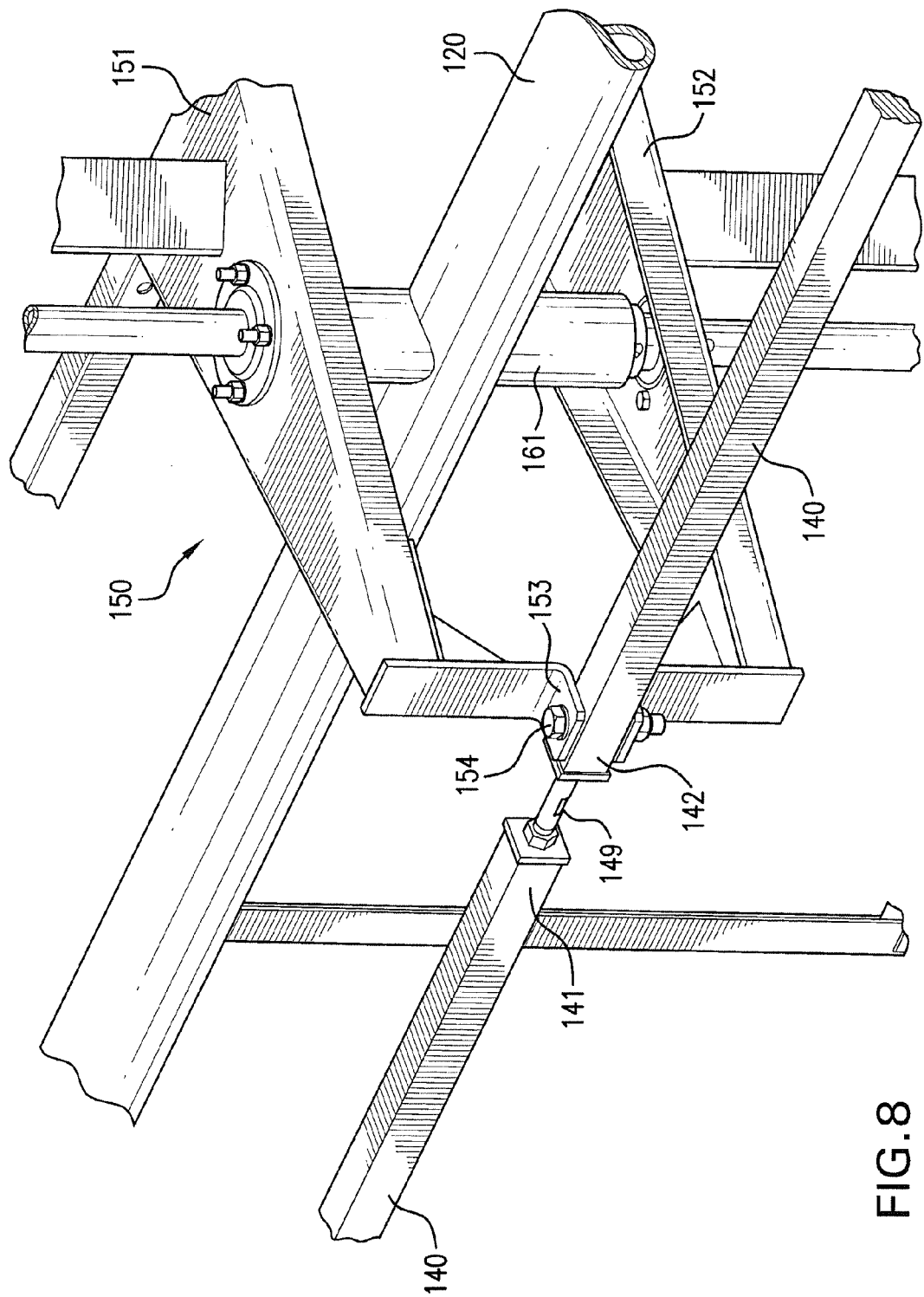
FIG. 8 is a perspective view of a coupling connected to linkages according to one embodiment.

A coupling 150 is attached to each mount 160 to enable the mount 160 and attached solar cell modules 200 to rotate about the second axis B. As best illustrated in FIGS. 3, 7, and 8, couplings 150 include first and second arms 151, 152 that are positioned on opposing sides of the base 161. The first arm 151 is operatively connected to a first mount 160, and the second arm 152 is operatively connected to a second mount 160. The arms 151, 52 are connected together at a neck 153. Arms 151, 152 may be constructed from separate pieces that are connected together with a fastener 154 that extends through the neck 153.

The couplings 150 are connected to rotate about the first axis A during rotation of the longitudinal support 120. The couplings 150 are also attached in a manner to rotate about the second axis B with the mounts 160. Because the arms 151, 152 are not connected to the base 161, the coupling 150 moves relative to the base 161 and longitudinal support 120 during rotation about the second axis B. In one embodiment, the arms 151, 152 are connected to the pivot member 165 that extends along a rear of the mounts 160.

Linkages 140 are connected to the mounts 160 for rotating the solar cell modules 200 about the second axes B. Each linkage 140 includes a first end 141 and a second end 142. The linkages 140 are attached together in a string aligned substantially parallel to the longitudinal support 120. FIGS. 3 and 7 include an embodiment with each coupling 150 attached to two separate linkages 140. Specifically, a first end 141 of a first linkage 140 and a second end 142 of a second linkage 140 are each connected to the coupling 150. The ends 141, 142 of the adjacent linkages 140 may be connected together by a common fastener 166 that extends through the neck 153 of the coupling 150.

FIG. 8 includes an embodiment with a single linkage 140 connected to the coupling 150. The end 142 is positioned between the arms 151, 152 and connected with a fastener 154. The adjacent linkage 140 is positioned in an end-to-end orientation and spaced away from the coupling 150. A connector 149 connects the linkages 140 together in the end-to-end orientation.

Figure 9:
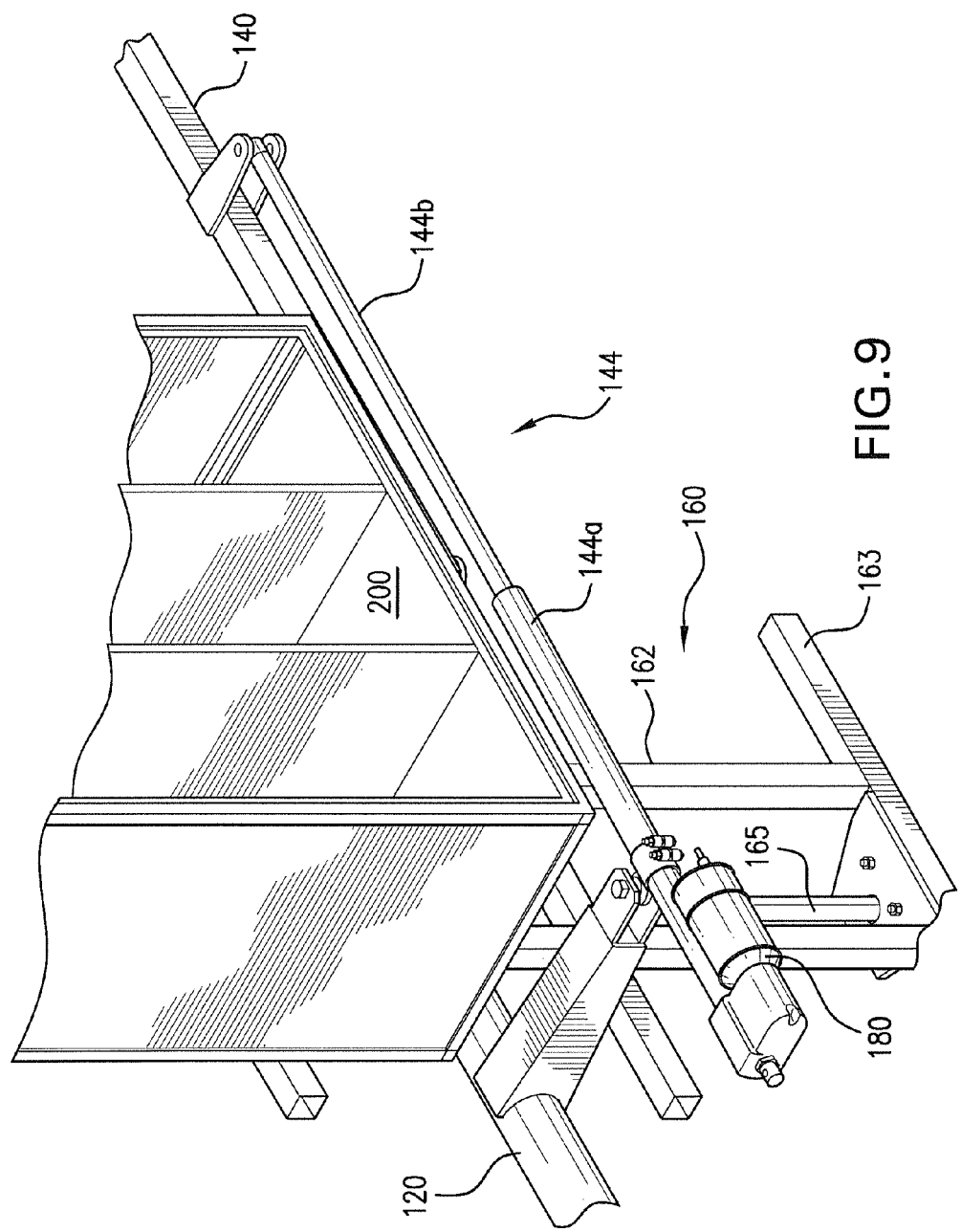
FIG. 9 is a partial perspective view of a mount connected to a longitudinal support and a drive operatively connected to the longitudinal support according to one embodiment.

A drive 180 is attached to a drive linkage 144 as illustrated in FIG. 9. The drive linkage 144 includes a first section 144a and a telescoping second section 144b. The first section 144a is operatively connected to the drive 180, and the second section 144b is operatively connected to a linkage 140. The drive 180 provides a force for moving the drive linkage 144 and the attached linkages 140 and thus pivoting the solar cell modules 200 about the second axes B. The number of linkages 140 in the string that is moved by the drive 180 and the drive linkage 144 may vary depending upon the context of use. In one embodiment, one or more additional drives 180 are positioned along the linkage string that work in combination with the drive 180 to move the linkages 140.

Figure 10:
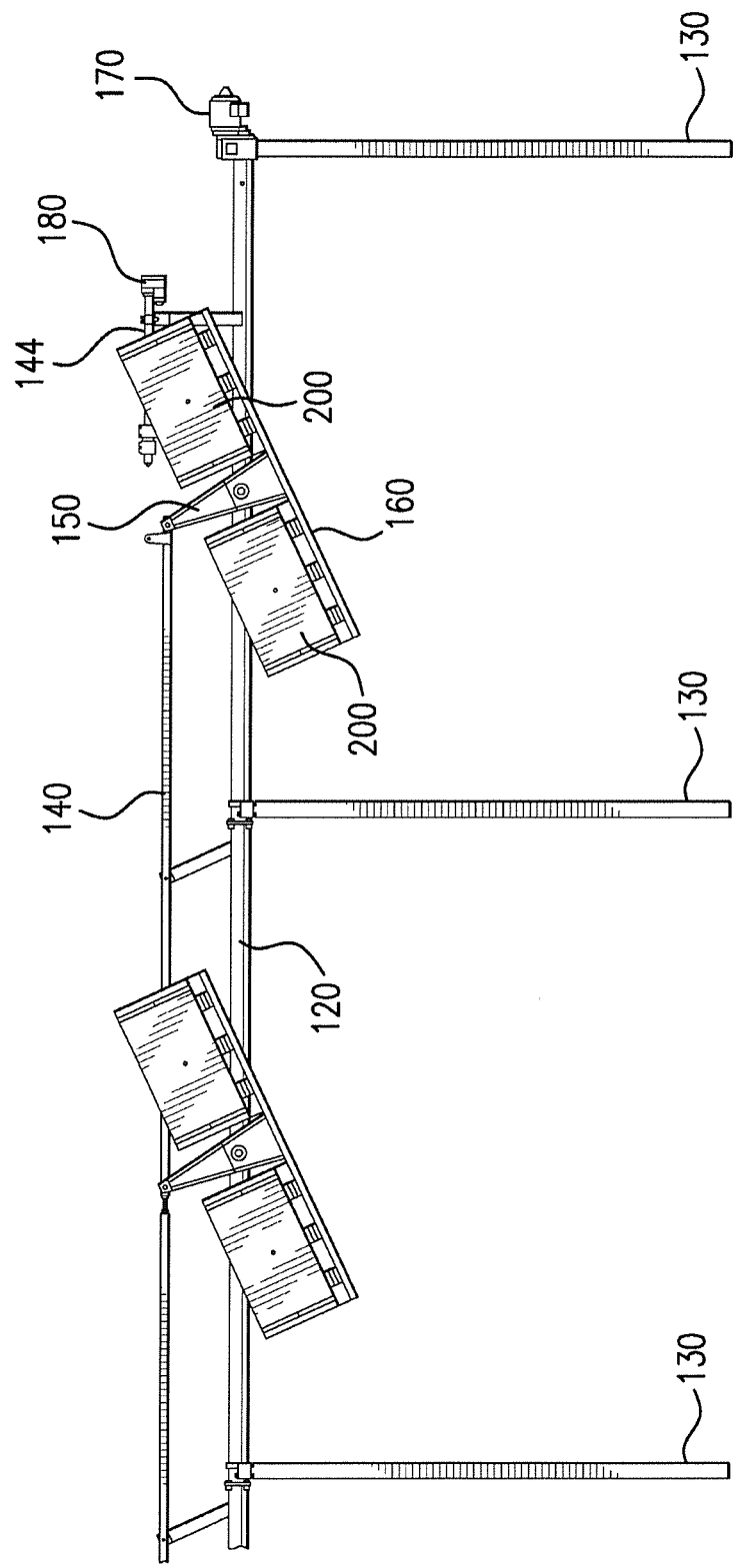
FIG. 10 is a top view of a portion of a terrestrial solar tracking photovoltaic array according to one embodiment.

FIG. 10 includes an embodiment with the drive linkage 144 connected to one or more mounts 160 adjacent to the drive 180. The mounts 160 are operatively connected to a linkage 140 through a coupling 150 as described above. The drive 180 directly rotates the mounts 160 with the rotational force being applied to the other, downstream linkages 140 through the coupling 150.

The array 100 is constructed to facilitate rotation of the longitudinal support 120 about the first axis A. The array 100 is designed to balance the power load requirements of the drive 170 during rotation through the various angular positions about the first axis A. One manner of balancing the load requirements is placing the mounts 160 and solar cell modules 200 such that a center of gravity of the array 100 passes through the longitudinal support 120 at the various rotational positions of the array 100. The center of gravity may be perpendicular to the longitudinal support 120 when viewed from an end of the array 100 and pass through the longitudinal support and downward into the Earth.

FIGS. 1 and 5 each illustrate examples of this positioning with equal numbers of mounts 160 and solar cell modules 200 extending outward from the opposing sides of the longitudinal support 120. FIGS. 1 and 5 illustrate the mounts 160 and solar cell modules 200 aligned in pairs that are directly across the longitudinal support 120 from each other. Other spacings may include the mounts 160 and solar cell modules 200 being unpaired and scattered along the length. The balanced system maintains a near constant potential energy as rotation in a first direction is facilitated by the weight of the mounts 160 and solar cell modules 200 that extend outward from a first side, and rotation in a second direction is facilitated by the opposing mounts 160 and solar cells 200 that extend outward from a second side of the longitudinal support 120.

Figure 13:
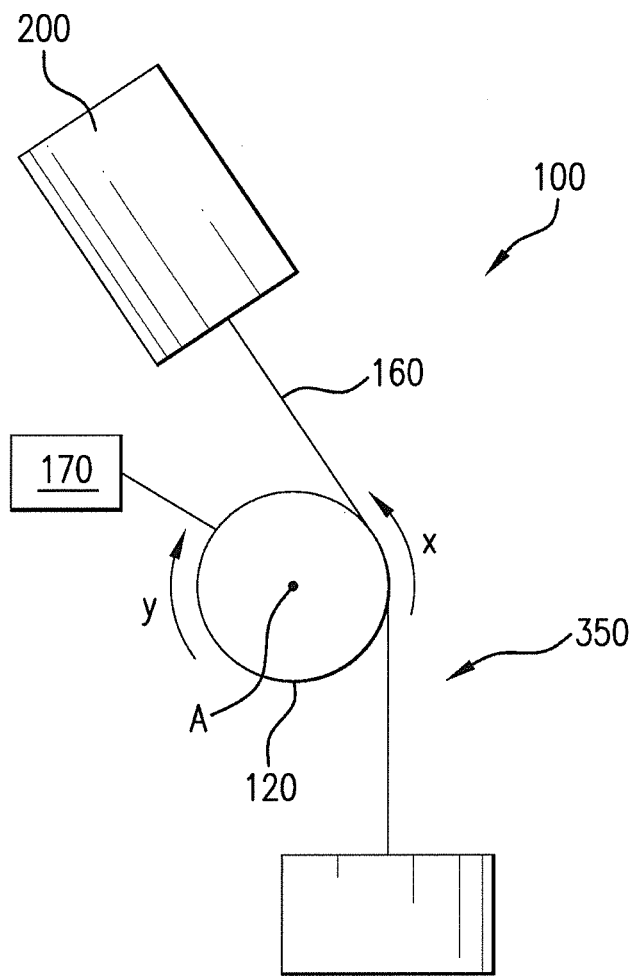
FIG. 13 is a schematic end view of a balancing mechanism operatively connected to a terrestrial solar tracking photovoltaic array according to one embodiment.

FIG. 13 illustrates a schematic end view of the array 100 with one or more solar cell modules 200 connected to the longitudinal support 120. The drive 170 is connected to rotate the longitudinal support 120 and the modules 200 about the longitudinal axis A to track the elevation of the sun during the course of the day. The drive 170 rotates the longitudinal support to track the sun from a starting point at a beginning of the day to an ending point at the end of the day. The positioning of the array elements may maintain the center of gravity extending through the longitudinal support 120 and downward into the Earth at the various rotational positions. In the embodiment of FIG. 13, the drive 170 rotates the longitudinal support in a counterclockwise direction indicated by arrow X during the course of the day. Prior to the start of the next day, the drive rotates the longitudinal support 120 in the opposite direction indicated by arrow Y (i.e., clockwise direction as illustrated in FIG. 13). The rotation in the second direction Y prepares the array 100 for tracking the elevation of the sun during the following day. In one embodiment, the drive 170 takes only a short period of time (e.g., several minutes) to rotate the array in the second direction from the ending point to the starting point.

During an initial period of the day, the weight of the array 100 is such that the drive 170 applies a force to rotate the array 100 in the direction X. At some point during the day, the distribution of mass of the array 100 shifts and the weight tends to rotate or pull the array 100 in the direction X. This shifting that causes the array to tend to rotate forward is referred to as backlash. In one embodiment, once this occurs, the drive 170 applies a braking force to slow the rotation such that the array 100 continues to track the elevation of the sun during the remainder of the day. In one embodiment, this point starts immediately after the solar cell modules 200 reach a specific rotational position, such as but not limited to a top-dead-center rotational position relative to the longitudinal support 120. When this occurs, the weight of the array 100 causes a strain on the drive 170 as the drive 170 now acts against the pulling force of the array 100. This may negatively affect the positional accuracy of the array 100 causing the modules 200 to become out of alignment with the sun during the course of the day.

Figure 14A:
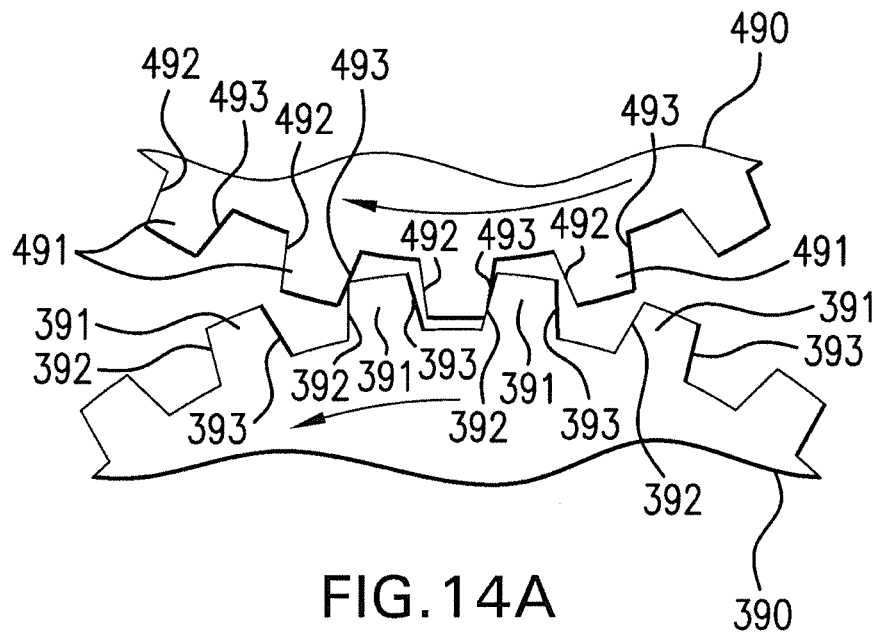
FIG. 14A is a schematic side view of gears of a drive train in a first orientation according to one embodiment.
Figure 14B:
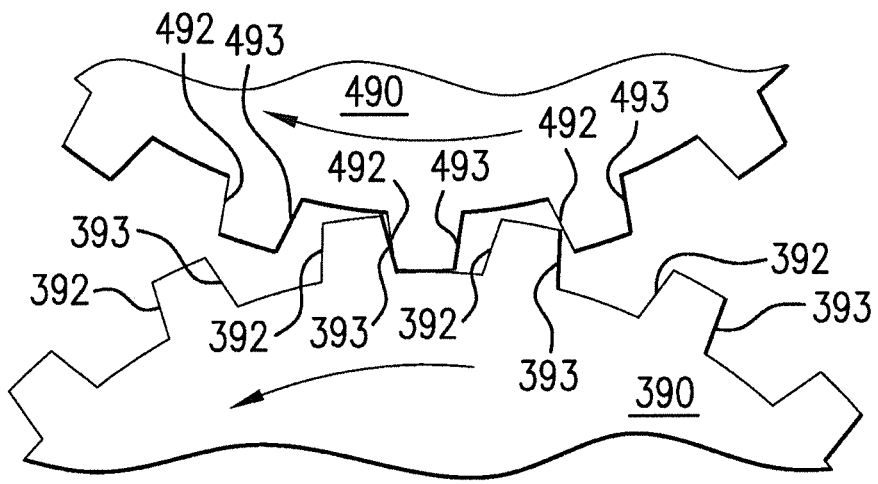
FIG. 14B is a schematic side view of gears of a drive train in a second orientation according to one embodiment.

Further, this backlash shift could cause gears in the drive 170 and/or the longitudinal support 120 to become disengaged. FIGS. 14A and 14B illustrate the orientations of the gears 390, 490. Gear 390 is operatively connected to the drive 170 and engages with gear 490 operatively connected to the longitudinal support 120. Gears 390, 490 may be the only two gears of a drive train that connects the drive 170 with the longitudinal support 120, or may be two of a more extensive drive train. Gear 390 includes a plurality of teeth 391 spaced around the perimeter each with a first edge 392 and a second edge 393. Likewise, gear 490 includes a plurality of teeth 491 each with first and second edge 492, 493. Gears 390, 490 may be substantially similar, or may include different sizes, number of teeth, and/or teeth spacing depending upon the context of use.

FIG. 14A illustrates the orientation when the drive 170 applies a force to rotate the longitudinal support 120. The first edges 392 of the teeth 391 of gear 390 contact against the second edges 493 of the teeth 419 of gear 490. This contact transfers the force of the drive 170 through the gears 390, 490 to rotate the longitudinal support 120.

In the event of a backlash shift as illustrated in FIG. 14B, the rotational speed of gear 490 is greater than the rotational speed of gear 390. This causes gear 490 to rotate ahead of gear 390 and there is no longer contact between edges 392 and 493. Gear 490 rotates ahead with the first edges 492 contacting against the second edges 393. In some instances, this contact causes the gear 490 to actually drive gear 390 until the array 100 settles to an equilibrium position. This causes the solar cell modules 200 to become misaligned with the sun. In one embodiment, the array 100 rotates forward an amount with the solar cell modules 200 being located vertically below the longitudinal support 120.

To prevent this from occurring, a balancing or dynamic anti-backlash mechanism 350 may be connected to the array 100, FIG. 13 schematically illustrates a mechanism 350 that applies a force to the array 100 to urge rotation in the second direction Y. The mechanism 350 provides for the drive 170 to drive the longitudinal support with the surfaces 392 on gear 390 remaining in contact with the surfaces 493 of gear 490. The mechanism 350 may maintain the balancing of the array 100 with the center of gravity aligned through the longitudinal axis A at each of the various rotational positions.

FIG. 3 illustrates a dynamic anti-backlash mechanism 350 that includes a pulley 351, weight 352, and cable 353. The pulley 351 is connected to the longitudinal support 120. FIG. 3 illustrates the pulley 351 at the end of the longitudinal support 120, although other embodiments may position the pulley 351 at different locations along the length. The weight 352 is attached to the pulley 351 by the cable 353. The weight 352 hangs downward from the pulley 351 and may ride along guide rails (not illustrated). The cable 353 may include a variety of lengths and constructions, including rope, chain, and braided wire.

In use, the weight 352 may be spaced a distance from the longitudinal support 120 at the start of the day. As the day progresses, the drive 170 rotates the longitudinal support 120 in a first direction causing the cable 352 to wrap around the pulley 351 and move the weight upward towards the longitudinal support 120. The mechanism 350 applies a counterbalance force to the array 100 to counteract the backlash weighting that may occur at some point during the day. At the end of the day, the weight 352 is positioned in closer proximity to the longitudinal support 120. Prior to beginning tracking during the next day, the drive 170 rotates the longitudinal support in a second opposite direction. This causes the cable 353 to unwind from the pulley 351 and the weight 352 to move downward away from the longitudinal support 120. This force applied by the mechanism 350 to the array 100 assists the drive 170 in rotating the array 100 back to the starting position.

Figure 11:
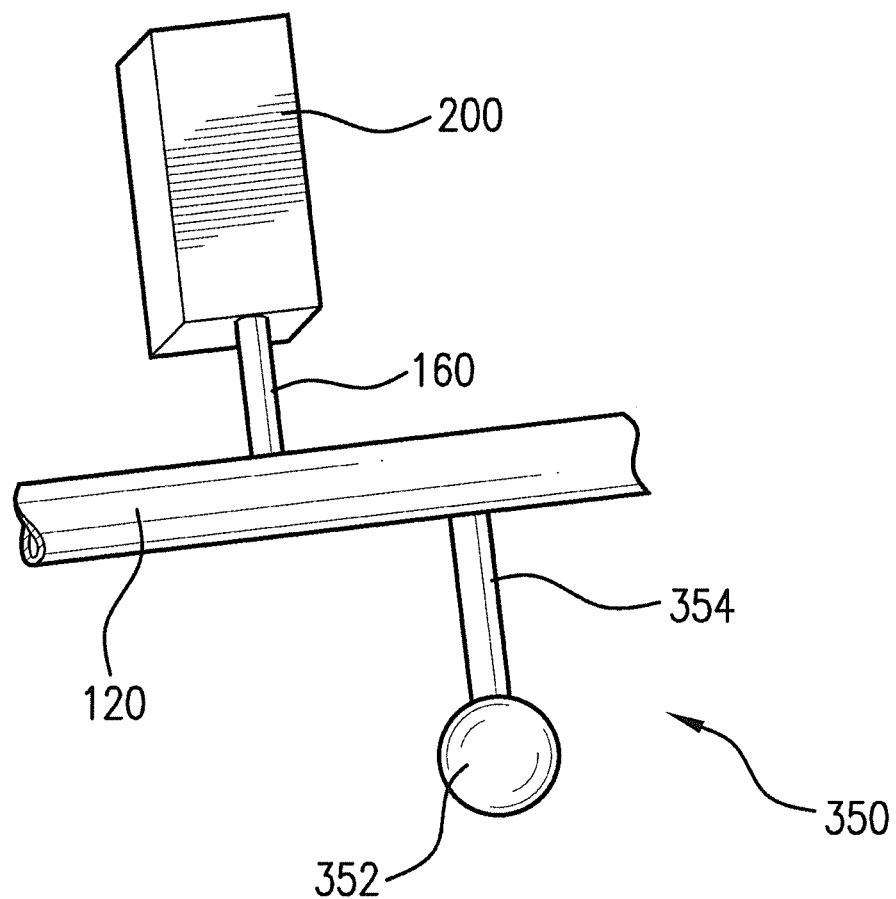
FIG. 11 is a schematic side view of an anti-backlash mechanism extending outward from a longitudinal support according to one embodiment.

FIG. 11 includes an anti-backlash mechanism 350 with the weight 352 positioned on a rigid support 354 that extends outward from the longitudinal support 120. The amount of the weight 352 and the length of the support 354 are configured to assist the drive 170 in rotation of the array 100.

The dynamic anti-backlash mechanisms 350 may be configured for the drive 170 to apply a constant torque to the longitudinal support 120 during rotation in the first direction. The drive 170 may further include a controller to apply a constant torque to the longitudinal support 120.

The dynamic anti-backlash mechanisms 350 may balance an unbalanced array 100. The uneven balancing may be caused by and uneven number of mounts 160 and solar cell modules 200 on one side of the longitudinal support 120. The amount of the weight 352 and length of the support 354 are determined to counterbalance the otherwise uneven weight distribution on the longitudinal support 120.

The balanced weighting of the array 100 eliminates or reduces weight loading and frictional loading issues with the drive 170. This reduces power requirements for the drive 170 and frictional wear on the drive train. The balanced weighting may also improve tracking of the array 100 due to reduced strain in the drive 170 and drive train.

Figure 12:
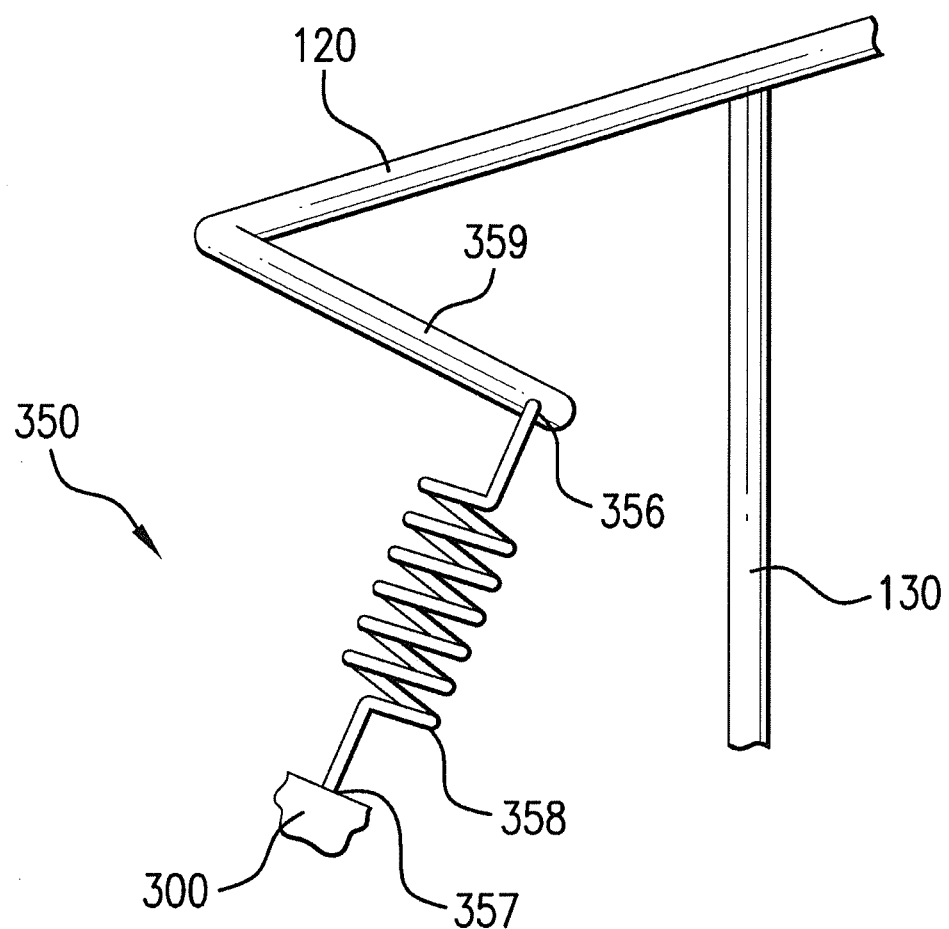
FIG. 12 is a partial schematic view of a biasing member operatively connected to the longitudinal support according to one embodiment.

The dynamic anti-backlash mechanism 350 may also include one or more tension members connected to the longitudinal support 120. FIG. 12 includes an embodiment with a tension member 358 operatively connected to the longitudinal support 120. The tension member 358 includes a first end 356 attached to the longitudinal support 120, and a second end 357 anchored at a point away from the longitudinal support such as on the surface 300, vertical support 130, or other. An extension arm 359 may extend outward from the longitudinal support 120 and provide an attachment point for the first end 356 away from the longitudinal support 120. In use, rotation of the longitudinal support 120 causes the tension member 358 to elongate and apply a return force. The tension member 358 may apply a greater force the farther the longitudinal member 120 rotates to offset the increasing weight offset caused by rotation of the array 100. The tension member 358 may further include a coil spring that extends around the longitudinal support. One of the first and second ends 356, 357 is attached to the longitudinal support 120. Rotation of the longitudinal support 120 causes the tension member 358 to again provide a return force.

In one specific embodiment, the dynamic anti-backlash mechanism 350 includes two tension springs each with a 160 lb maximum force that are anchored to one of the vertical supports 130. The longitudinal support 120 includes a sprocket that is connected to the springs with a chain. In one embodiment, the sprocket is a Martin 50A65 sprocket, and the chain includes three feet of #50 chain. During the course of the day, the dynamic anti-backlash mechanism 350 applies varying amounts of force as the array moves to track the sun. In the morning, the moment created by the array 100 acts counterclockwise and the dynamic anti-backlash mechanism 350 works as an anti-backlash device with the springs in a relaxed condition and contributing very little force. By noon, the array 100 is practically balanced and the springs produce about half of the force (about 80 lbs each in the embodiment of the 160 lb springs) creating a counterclockwise anti-backlash moment. Later in the afternoon, the moment created by the array 100 changes polarity and acts in the opposite direction with the springs producing near full force that is capable to overpower the force in the opposite direction and still act as an anti-backlash mechanism.

Figure 15:
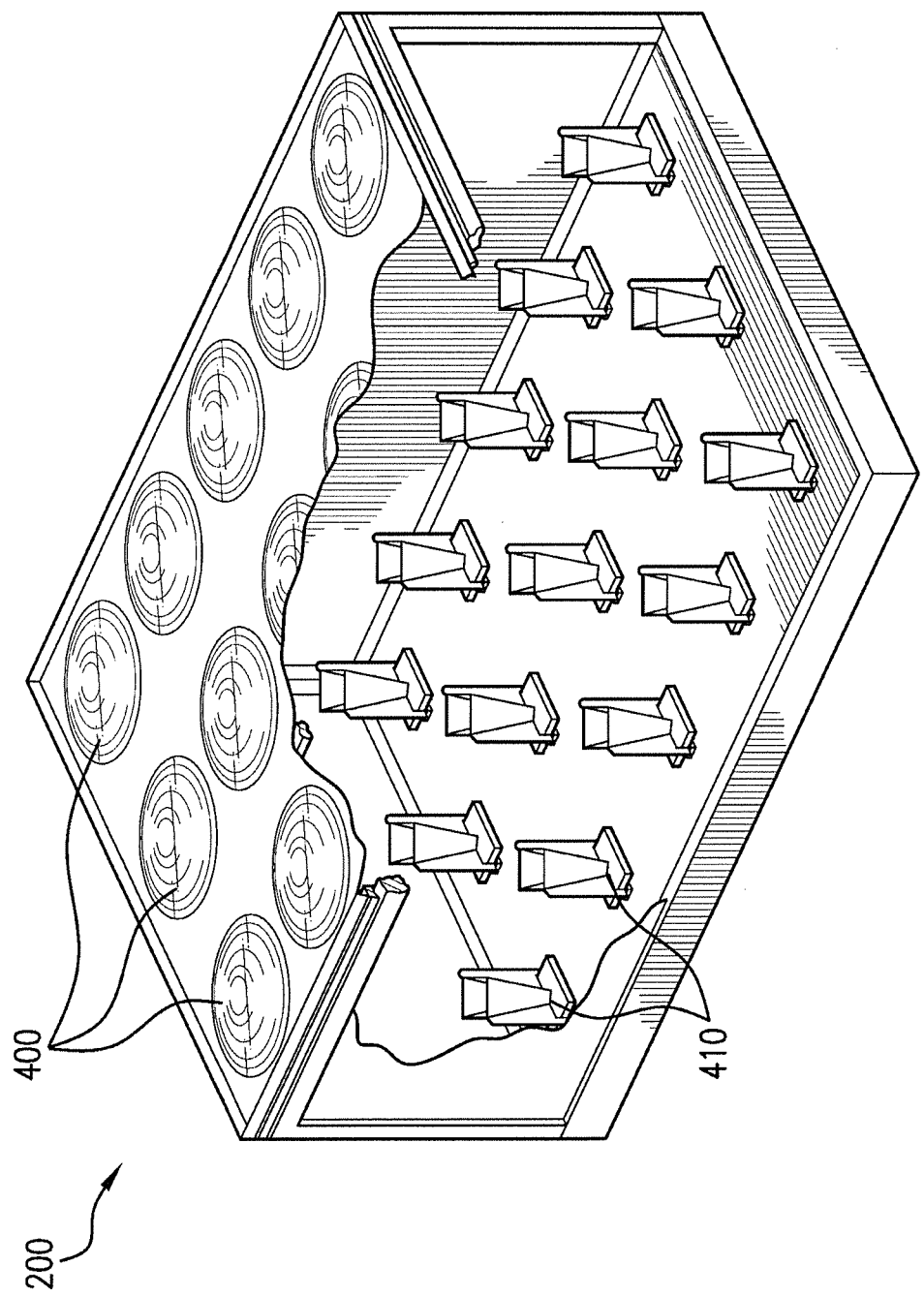
FIG. 15 is a perspective cut-away view of a solar cell array module according to one embodiment.

In one embodiment, the solar cell modules 200 are each about 43" by 67". FIG. 15 illustrates an embodiment of a solar cell module 200 with an aluminum frame and plastic or corrugated plastic sides that reduce the overall weight to about 70 pounds. In one embodiment, each solar cell module 200 includes a 3×5 array of lenses 400 that are positioned over corresponding receivers 410. The lenses may include various shapes and sizes with one specific embodiment including lenses that are about 13" square. Further, the focal length between the lenses 400 and the receivers 410 is about 20".

When mounted on the surface 300, the longitudinal support 120 may be positioned in a north N-south S orientation as illustrated in FIG. 1. In one embodiment, the surface 300 is the surface of the Earth. The longitudinal support 120 includes a length to space a desired number of solar cell modules 200. Throughout the course of the day, the array 100 is adjusted to maintain the solar cell modules 200 facing towards the sun. The drive 170 may be periodically activated to provide a force to rotate the longitudinal support 120 and hence each of the mounts 160 and attached solar cell modules 200. The force applied by the drive 170 provides for each of the solar cells receivers 200 to be moved a same amount such that each solar cell array module 200 is synchronized and move in unison. Rotation of the longitudinal support 120 may provide for the solar cell modules 200 to track the elevation of the sun during the course of the day.

In addition to the rotation of the longitudinal support 120, the one or more drives 180 move the linkages 140 to further maintain the solar cell modules 200 aligned with the sun. The drive(s) 180 are periodically activated to move the first linkage 140a and attached string of linkages 140. This movement causes the couplings 150 and attached mounts 160 and solar cell modules 200 to pivot about the various axes B. These axes B may be orthogonal to the axis A. The string of linkages 140 provides for each of the solar cell modules 200 to again move in unison about their respective axis B. The movement about the B axes may allow the solar cell modules 200 to track the azimuthal position of the sun during the course of the day.

A controller 190 may control the movement of the terrestrial solar tracking array 100. The controller 190 may include a microcontroller with associated memory. In one embodiment, controller 190 includes a microprocessor, random access memory, read only memory, and in input/output interface. The controller 190 controls operation of the one or more drives 170 for rotating the longitudinal support 120 and the solar cell modules 200 about the first axis A. The controller 190 further controls the one or more drives 180 for driving the linkages 140 and rotating the solar cell modules about the second axes B. The controller 190 may include an internal timing mechanism such that the operation of the drives corresponds to the time of day for the solar cell modules 200 to track the azimuth and elevation of the sun.

The shadow cast by a given solar cell module 200 depends on its size and shape, and also on its location relative to the location of the sun in the sky. In the East-West direction, the sun location can vary by up to 150°. In this connection, it should be noted that it is generally accepted that, where the elevation of the sun is below 15° above the horizon, its rays are of insufficient strength to generate a useful amount of electricity. The latitude at which the solar cell array 100 is positioned is, therefore, of little influence.

In the North-South direction, the sun location varies by 46°, given that the earth's axis is tilted at an angle of 23° with respect to its orbit around the sun. In this connection, it will be appreciated that latitudes below 23° are subject to different conditions, and that latitudes above 45° are probably not relevant due to poor direct normal insolation (DNI) levels.

The solar cell array 100 is constructed in a manner to eliminate or minimize shadowing problems between solar cell modules 200. In one embodiment, the longitudinal support 120 and the individual sections 121 of the solar cell modules 200 are sized to space apart each module 200 such that it is fully illuminated for positions where the sun is 15° above the horizon, and that there is no shadowing of any given module 200 by any other module 200.

Figure 16:
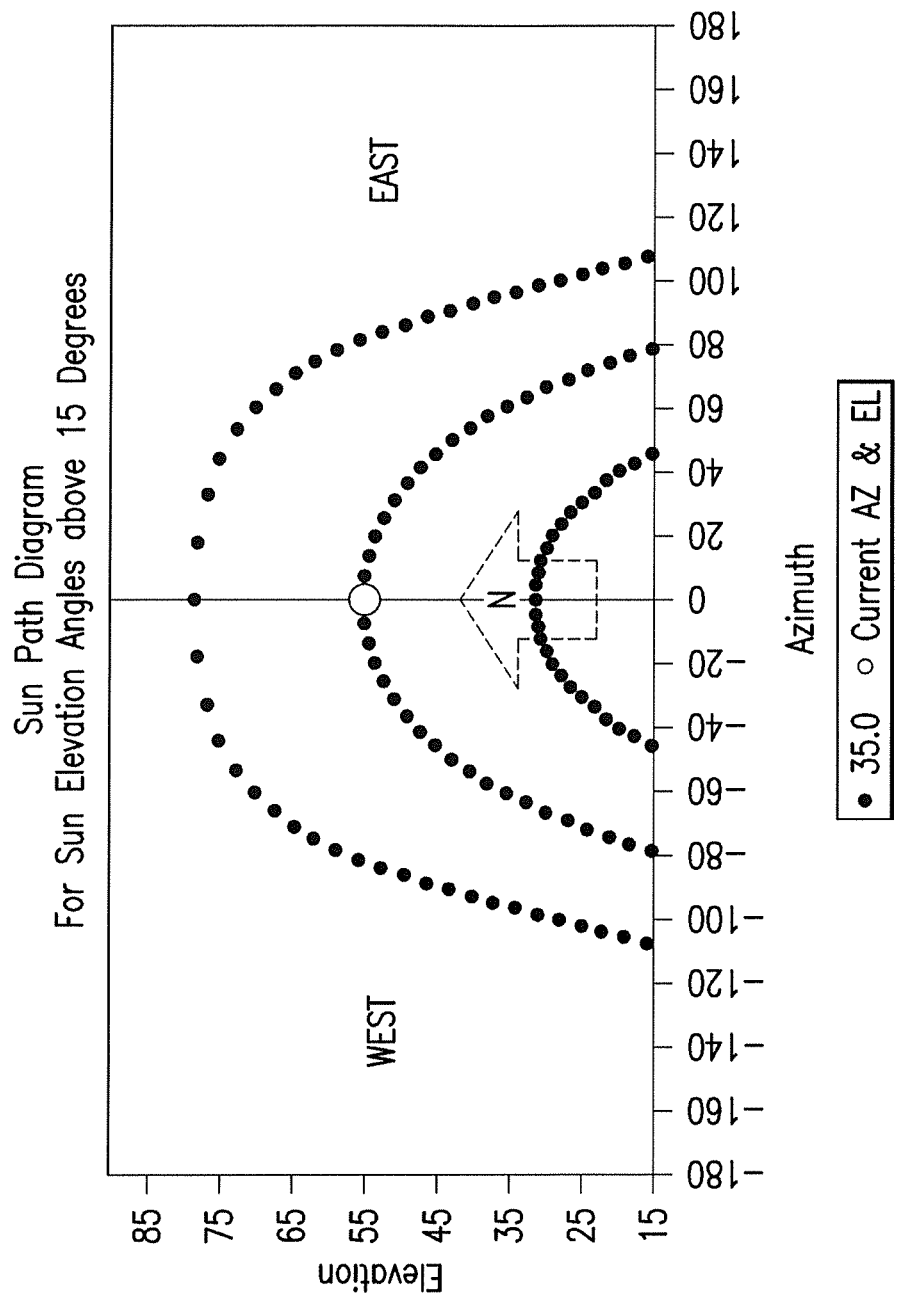
FIG. 16 is a graph illustrating the sun's path on the earth as a function of elevation and azimuth.

FIG. 16 is a sun path diagram showing the elevation of the sun for all angles above 15° at a latitude of 35° North. The graph shows the sun path for three times of the year, namely at the summer solstice (indicated by the highest dotted line), at the winter solstice (indicated by the lowest dotted line), and at the equinoxes (indicated by the middle dotted line). At all other dates, the sun path falls within the envelope defined by the highest and lowest dotted lines. Thus, at the winter solstice, the sun path goes from a negative azimuth angle of about 45° to a positive azimuth angle of about 45°, and from an elevation of 15° to about 27°, and then back to 15°. Similar ranges are apparent for a sun path at the summer solstice and at the equinoxes.

Figure 17:
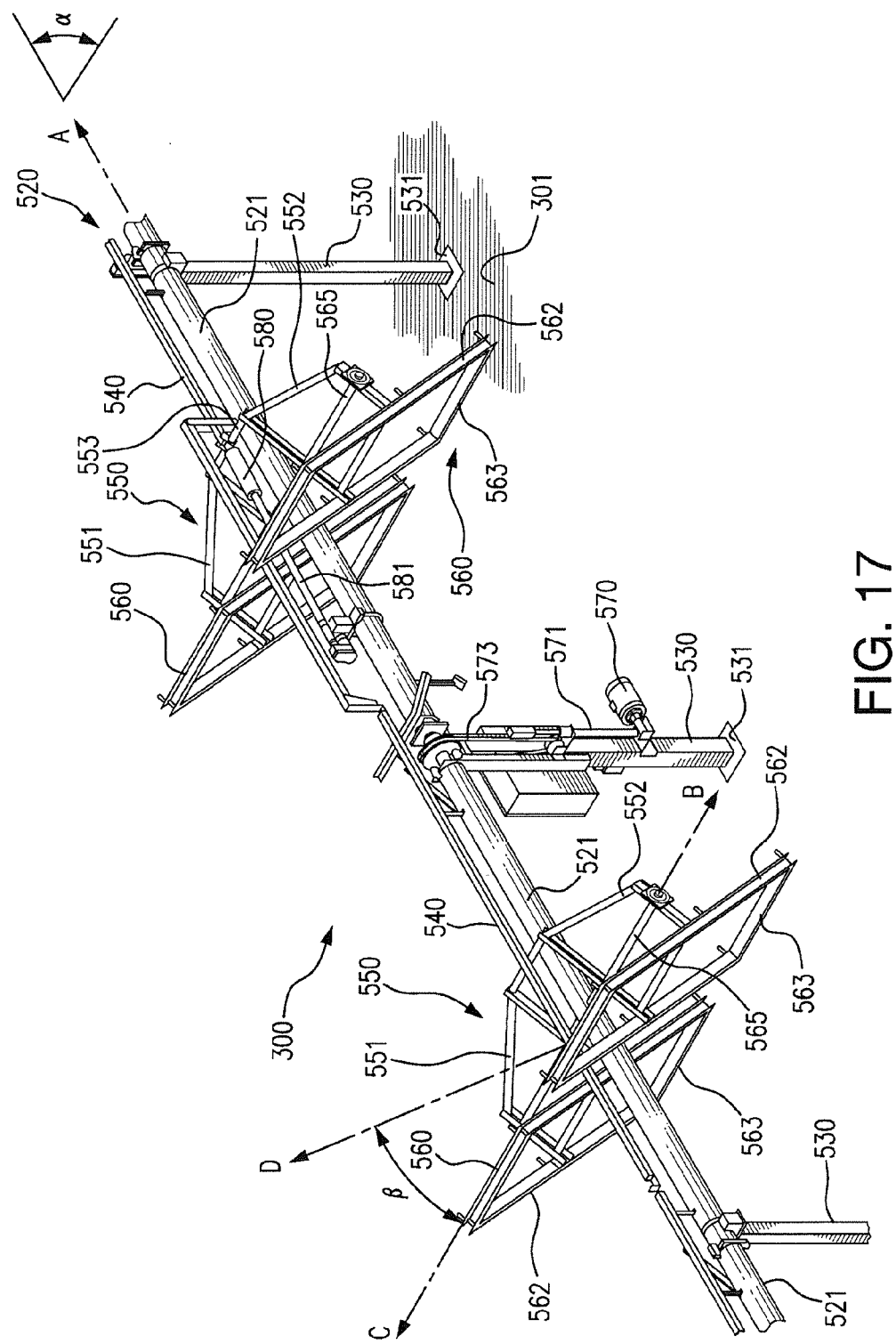
FIG. 17 is a perspective view of a terrestrial solar tracking photovoltaic array according to another embodiment.

FIG. 17 illustrates an embodiment of an array generally illustrated as mounted on the ground surface and supporting groups of solar modules. The array 300 includes an elongated longitudinal support 520 configured to mount solar cell modules 200 (not shown) in a longitudinally-extending and spaced-apart arrangement. The support 520 is able to rotate each of the solar cell modules 200 along a first axis A to simultaneously track the elevation of the sun during the course of a day. The support 520 is able to rotate each solar cell module 200 along axes B that are substantially perpendicular to axis A to generally track the azimuthal position of the sun during the course of the day. The combined motion long axis A and axis B tracks the elevation and azimuth of the sun.

The longitudinal support 520 is positioned and supported above a surface 301 by spaced-apart vertical supports 530. In one embodiment, the longitudinal support 520 is a single continuous piece. In one specific embodiment, the longitudinal support 520 is an axially connected series of torque tubes or pipes 521 each with a diameter of about 4 to 5.63 inches and includes a thickness of about 0.167 to 0.188 inches. The pipe 521 has a length of about 170 inches and weighs about 110 lbs.

The longitudinal support 520 is thereby constructed from a number of discrete pipes or sections 521 that are connected together in an end-to-end arrangement. The lengths and construction of each section 521 may be the same or may be different. In one embodiment, each section 521 is sized to mount a pair or multiple pairs of solar cell array modules 200. The modular design provides for a user to construct the longitudinal support 520 to a length needed to support a necessary number of solar cell modules 200 to achieve the desired power output. Sections 521 may be added to an existing array 300 to accommodate additional solar cell modules 200 as is necessary for the array 300 to produce the desired power output.

A control frame 550 and mounts 560 directly attach to and support the solar cell modules 200 and are connected to and supported by the longitudinal support 520. The mounts 560 may include a frame comprised of connected vertical members 562 and horizontal members 563 that support the solar cell modules 200. Mounts 560 may be of different sizes to accommodate different sizes and numbers of solar cell modules 200. The control frame 550 couples the mount to the longitudinal support 520 and to the actuating linkage 540 that allows the mount 560 to be pivoted with respect to the longitudinal support 520 when the linkage 540 is moved by suitable actuation.

More specifically, the mounts 560 include a pivot member 565 coupled to section 521 that facilitates pivoting motion of the solar cell modules 200 about second axes B so as to rotate them from plane C to plane D, as an example. Pivot member 565 may be located a short distance away from the plane of the mount 560, as depicted in the drawing. Further, the pivot member 565 may be a single elongated member or may be constructed of separate members that are positioned in an end-to-end orientation and connected. The pivot member 565 forms a part or section of the control frame 550.

The mounts 560 may be positioned at various spacings along the length of the longitudinal support 520.

The vertical supports 530 are spaced apart along the length of the longitudinal support 520. The vertical supports 530 include a length adequate to position the solar cell modules 200 above the surface 301 for rotation about the first axis A.

Therefore, the vertical supports 530 are longer than a height of the mounts 560 and the solar cell modules 200.

The vertical supports 530 are positioned along the longitudinal support 520 away from the mounts 560 to prevent interference with the movement of the solar cell modules 200. As illustrated in FIG. 17, the vertical supports 530 are spaced-apart from the solar cell modules 200 along the length of the longitudinal support 520. In this arrangement, the vertical supports 530 are in a non-overlapping arrangement with the solar cell modules 200. Various numbers of vertical supports 530 may be positioned along the length of the longitudinal support 520. In the embodiment of FIG. 17, a vertical support 530 is positioned between each pair of mounts 560. In other embodiments, the vertical supports 530 are spaced a greater distance apart along the longitudinal support 520. In one specific embodiment, the vertical supports 530 include a 4 inch by 4 inch rectangular shape steel tube, and include a wall thickness of about 0.188 inches. The vertical supports 530 may also be supported in a concrete pad or footing 531 on the surface 301.

A first drive 570 is connected to the longitudinal support 520 to provide a force to rotate the longitudinal support 520 about axis A. In one embodiment, drive 570 may be positioned at one side of a vertical support 530. Drive 570 may include a linear actuator 571 that engages with the drive chain 573 and thereby moves the drive chain as the linear motion of the actuator advances the position of the drive chain. Additional drives 570 may be connected along the length of the longitudinal support 520 to provide additional rotational force.

A first linkage or coupling 540 extends substantially parallel to the elongated frame 520 and is pivotably attached to each mount 560. When the coupling 540 is actuated, it moves in the axial direction A and thereby displaces the position of the mount 560 and its associated solar cell modules 200, around the pivot member 565, which then enables them to rotate about the second axis B. As illustrated in FIG. 17 frame 550 include first and second arms 551, 552 that are positioned on opposing sides of the section 521. The first arm 551 is fixedly connected to one end of pivot member 565, and the second arm 552 is fixedly connected to a second opposite end of pivot member 565. The arms 551, 552 are fixedly connected together at a neck 553. Arms 551, 552 may be constructed from separate pieces that are connected together with a fastener 554 that extends through the neck 553.

Figure 18:
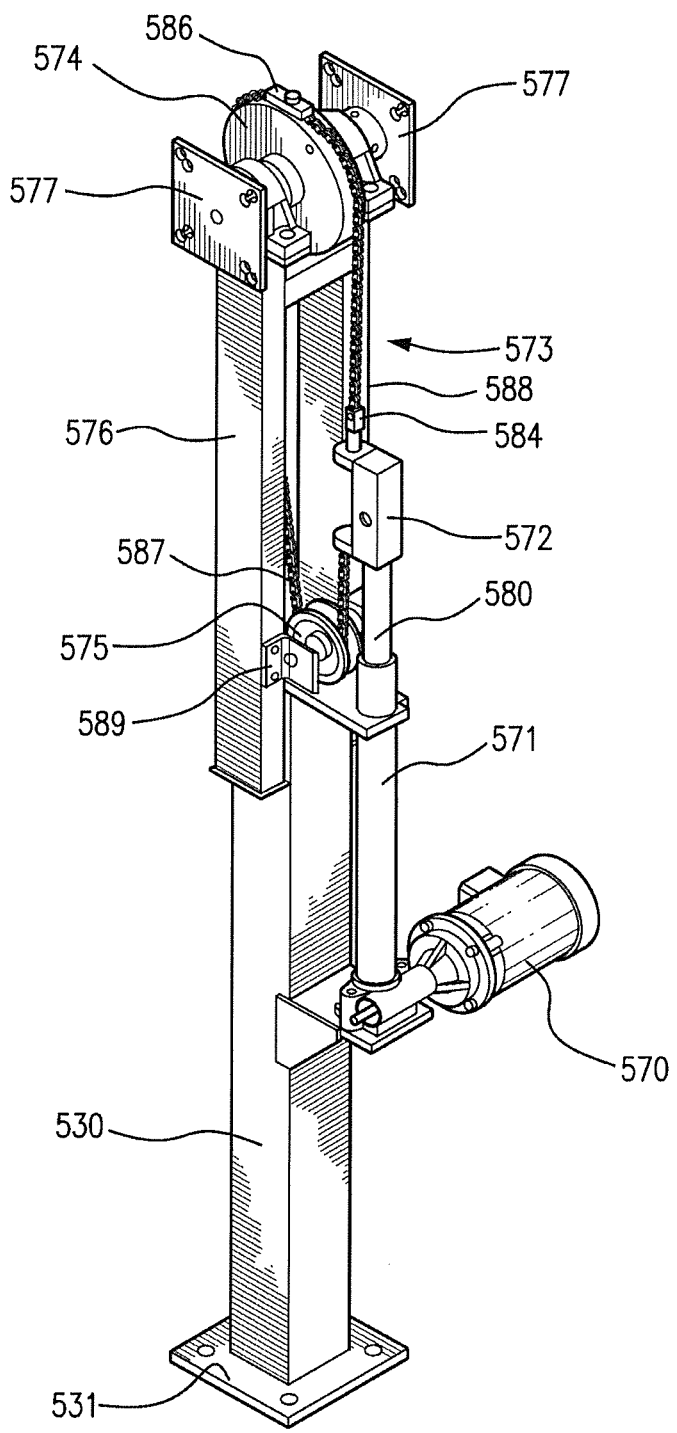
FIG. 18 is a partial perspective view of a chain drive connected to a vertical support and a drive operatively connected to the chain drive according to the embodiment of FIG. 17.

FIG. 18 is an enlarged partial perspective view of a single vertical support 530 with drive mounted on the vertical support and operatively connected to the chain drive according to the embodiment of FIG. 17. As noted above, a first drive 570 is depicted as connected to the longitudinal support 520 to provide a force to rotate the longitudinal support 520 about axis A. In one embodiment, drive 570 may be a motor positioned at one side of a vertical support 530. Drive 570 may include a linear actuator 571 having a movable piston or shaft 580 that that is attached to a coupling 572 that engages with the drive chain 573 and thereby moves the drive chain as the linear motion of the piston or shaft 579 advances the position of the coupling 572 and thereby the drive chain 573. The drive chain 573 includes two discrete separate members, a first member 587 attached by an anchor bolt 585 to the coupling 572, and a second member 588 attached by an anchor bolt 586 to the coupling 572. The two members 587 and 588 are joined together by a coupling 586. The drive chain 573 engages an upper sprocket gear 574 and a smaller diameter lower sprocket gear 575. The upper sprocket gear 574 is rotatably secured to the top of the vertical support 530. The lower sprocket gear 575 is secured to the side panel member 576 by a bracket 589.

Figure 19:
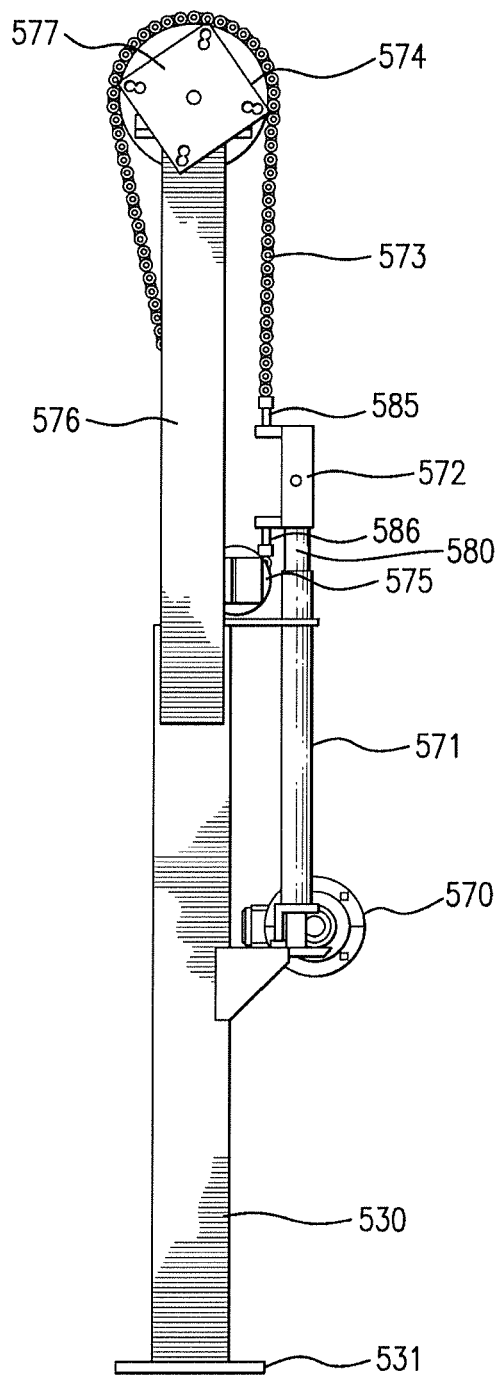
FIG. 19 is a schematic side view of a drive chain mechanism according to one embodiment.

FIG. 19 is a schematic side view of the vertical support of FIG. 18. The linear actuator 571 includes a shaft 580 that terminates at one end in a coupling 572 that attaches to the first member 587 and the second member 588, of the chain drive 573. The second member 588 of the chain drive 573 extends substantially parallel to the support 530 and engages an upper sprocket gear 574, which is attached to a coupling plate 577 which in turn couples to adjacent torque tubes 521. The first member 587 of the chain drive 573 engages a lower sprocket gear 575, which is secured to the side panel member 576 by a bracket 589 (shown in FIG. 20), which in turn is fixedly attached to the vertical support 530. The result of the motion induced by the linear actuator 571 is that the drive chain 573 rotates the longitudinal support 521 by an axial angle in excess of 180° over the full range of motion (forward and backward) of the linear actuator.

Figure 20:
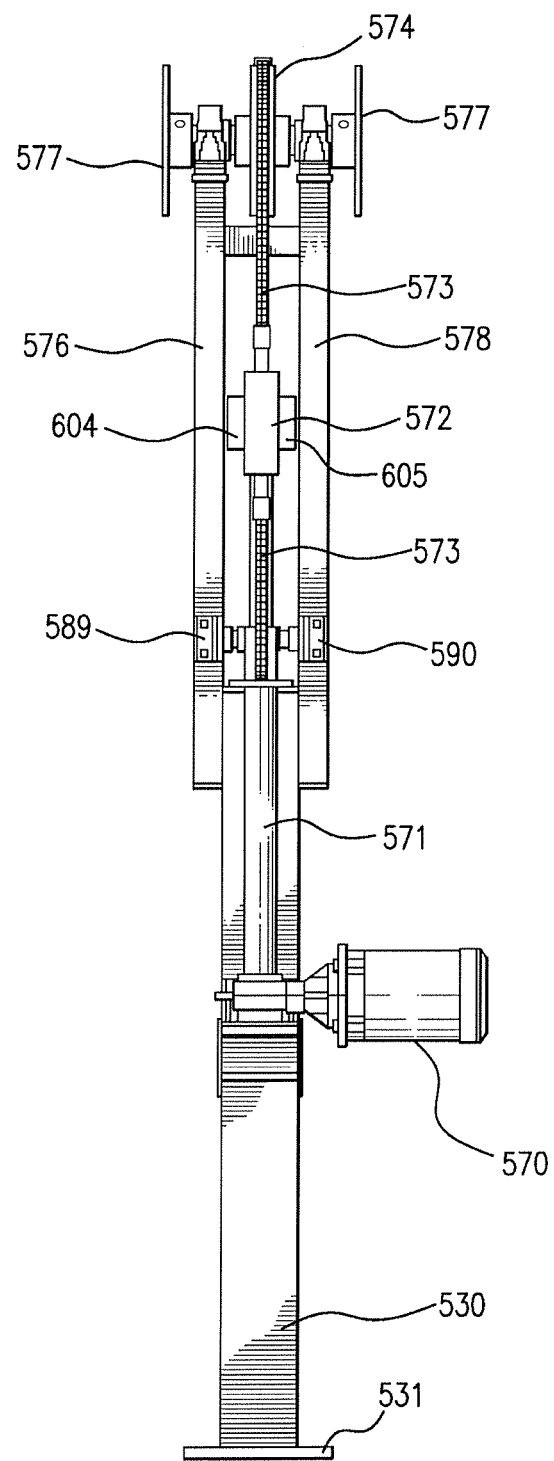
FIG. 20 is a schematic front view of a drive chain mechanism of FIG. 18.

FIG. 20 is a schematic front view of a drive chain mechanism of FIG. 18. In particular, there is depicted the two side panel members 576 and 578 fixedly attached to opposite sides of the vertical support 530. The upper sprocket gear 574 is depicted as attached to a pair of coupling plates 577, each coupling plate in turn adapted for coupling to the end plate of an adjacent torque tube. The drive chain 573 is depicted as rotatably engaging with the upper sprocket gear 574. The lower sprocket gear 575 is secured to the side panel member 576 by a bracket 589, and to side panel member 578 by a bracket 590.

Figure 21:
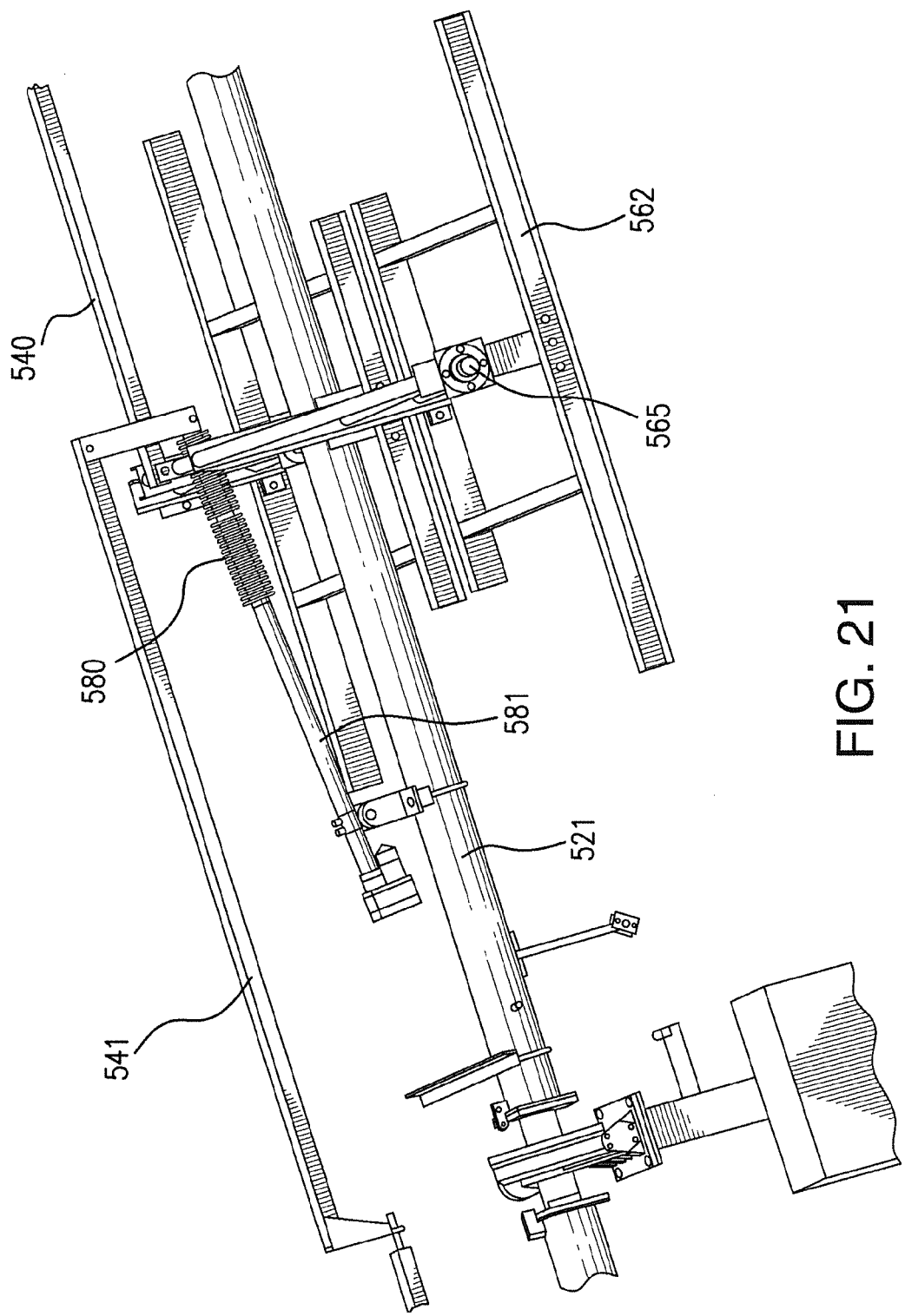
FIG. 21 is a partial perspective view of a linear actuator connected to a control frame and linkage according to the embodiment of FIG. 17.

FIG. 21 is a partial perspective view of a linear actuator connected to a control frame and linkage according to the embodiment of FIG. 17. In particular, there is depicted a portion of a longitudinal section 521 on which the second drive or linear actuator 581 is mounted. The linear actuator 581 has a movable piston or shaft 580 that that is attached to a coupling 540 and 541 that engages with the mount 560 and its associated solar cell modules 200 (not shown). As noted above, the movement of the movable piston or shaft 580 displaces the mount 560, so that it rotates about the second axis B around the pivot member 565, thereby enabling the solar cell modules 200 to move in a plane defined by the pivot member 565. As noted, the pivot member 565 extends through the cross-section and center axis of the longitudinal section 521, so that rotation about the pivot member 565 is substantially orthogonal to the plane of rotation of the solar cell modules 200 implemented by the rotation of the longitudinal section 521. Thus, the combined motion along the longitudinal long axis A, and the axis B solar cell modules 200 to track the elevation and azimuth of the sun as the sun traverses the sky during the course of the day.

Figure 22:
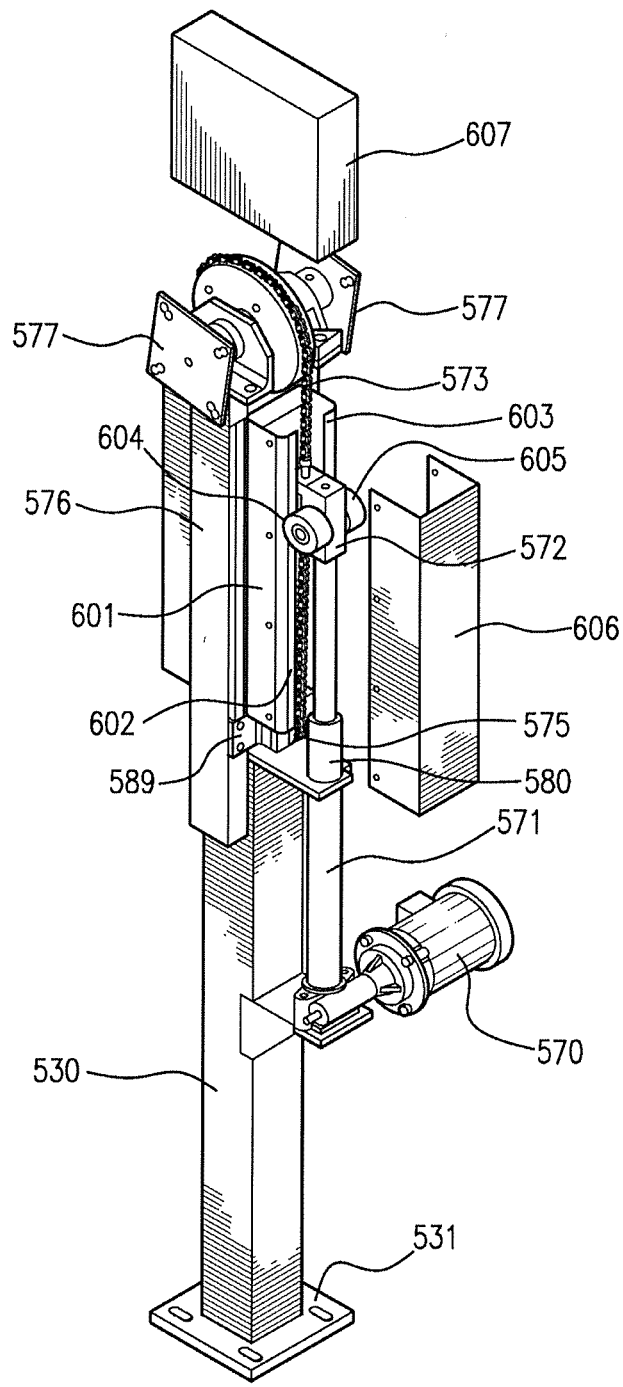
FIG. 22 is an exploded partial perspective view of the chain drive connected to a vertical support and a drive operatively connected to the chain drive according to one embodiment.

FIG. 22 is an exploded partial perspective view of the chain drive connected to a vertical support and a drive operatively connected to the chain drive according to one embodiment. In particular, there is depicted the coupling 572 that includes first 604 and second 605 wheels or rolling members disposed on opposite sides thereof. Planar tracks 602 and 603 are formed by a side portion of a front cover attached the side panel member 576 and 578 respectively. The first and second 604, 605 wheels planar tracks 602 and 603 respectively as the coupling 572 is advanced or retracted by the shaft 579. A cover member 606 is also depicted which functions to cover the chain drive 573 and coupling 572 to protect it from the ambient environment. Similarly, a cover member 607 is also depicted which functions to cover the upper sprocket gear 574 and the associated portion of the chain drive 573 to protect it from the ambient environment.

In one embodiment, the mount includes a first linear track engaging the first rolling member.

In one embodiment, the mount includes a second linear track engaging the second rolling member.

In one embodiment, the first linear track is disposed on a first side of the first and second rolling members, and said second linear track is disposed on a second opposite side of the first and second rolling members.

In one embodiment, the first and second linear tracks are parallel. The motion of then coupling is thereby guided and constrained by the wheels engaging the parallel tracks, so that the coupling, and thereby the chain drive, is properly positioned over its range of motion.

In one embodiment, the longitudinal support is a pipe with a diameter of about 4 inches with a coaxial first circular sprocket gear for engaging the drive chain, and a second circular sprocket gear mounted on the vertical support also for engaging the drive chain.

In one embodiment, the second circular sprocket gear has a smaller diameter than said first circular sprocket gear.

In one embodiment, the array further comprises a housing covering at least a portion of the linear actuator and mounted on said one mounted, wherein the interior surface of said housing forms a track for engaging the second rolling member.

In one embodiment, the array further comprises a housing covering the first circular sprocket gear.

The coupling member 572 has first and second rolling members 604 and 605 respectively disposed on opposite sides thereof. The guide member 601 is fixedly attached to the support 530 and encloses the drive chain 573 and protects it from exposure to the ambient environment. One side of the guide member 601 has a slot which allows the coupling 572 to move, and a left track 602 and a right track 603 on opposite sides of the slot. The first and second rolling members 604 and 605 engage the left track 602 and a right track 603 respectively during their course of motion as the drive chain the actuator 571 advances the position of the coupling 572 and the drive chain 573 to ensure that the drive chain 573 course of motion.

Figure 23:
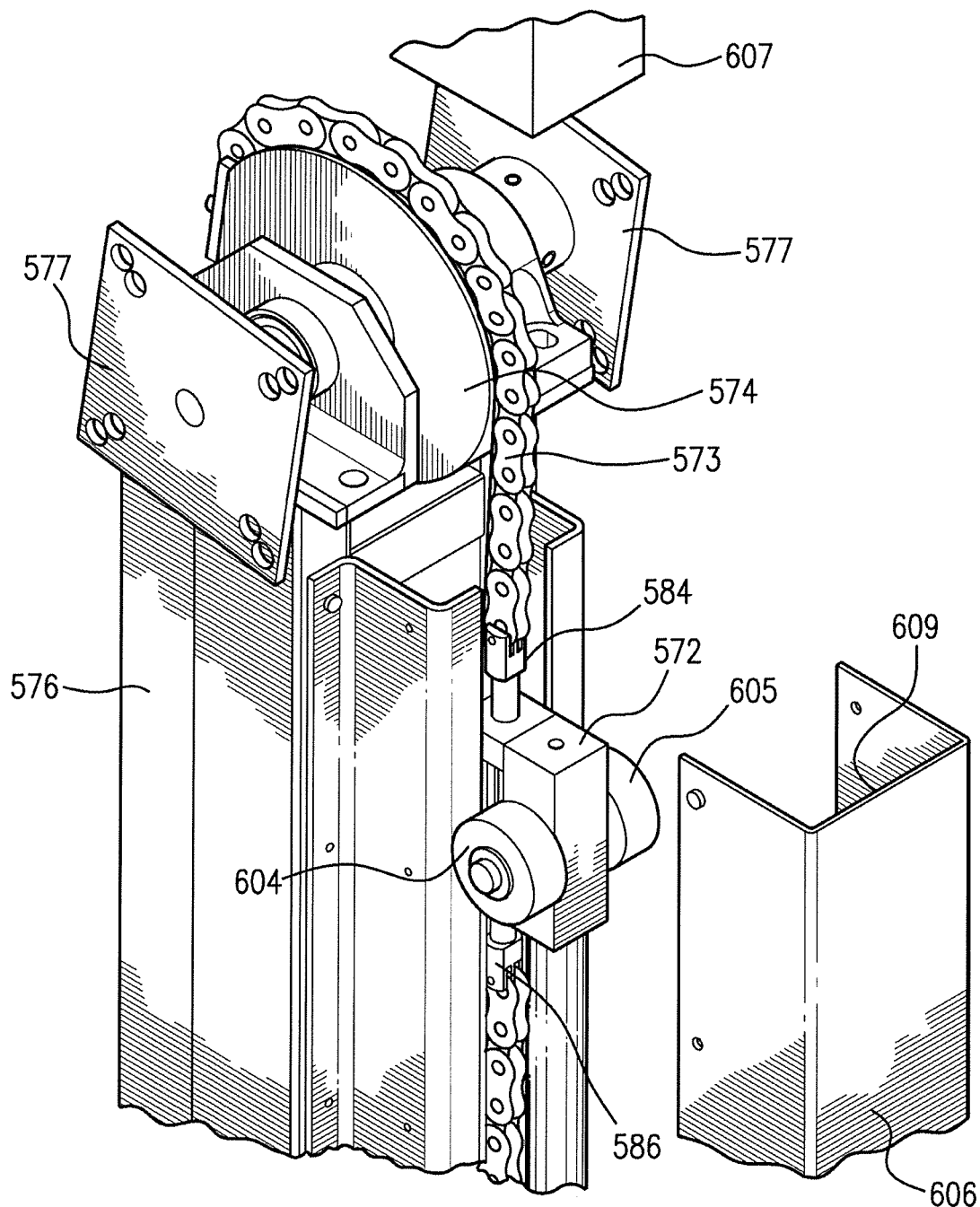
FIG. 23 is a partial perspective view of the chain drive connected to a vertical support and a drive operatively connected to the chain drive according to the embodiment of FIG. 22.
Figure 24:
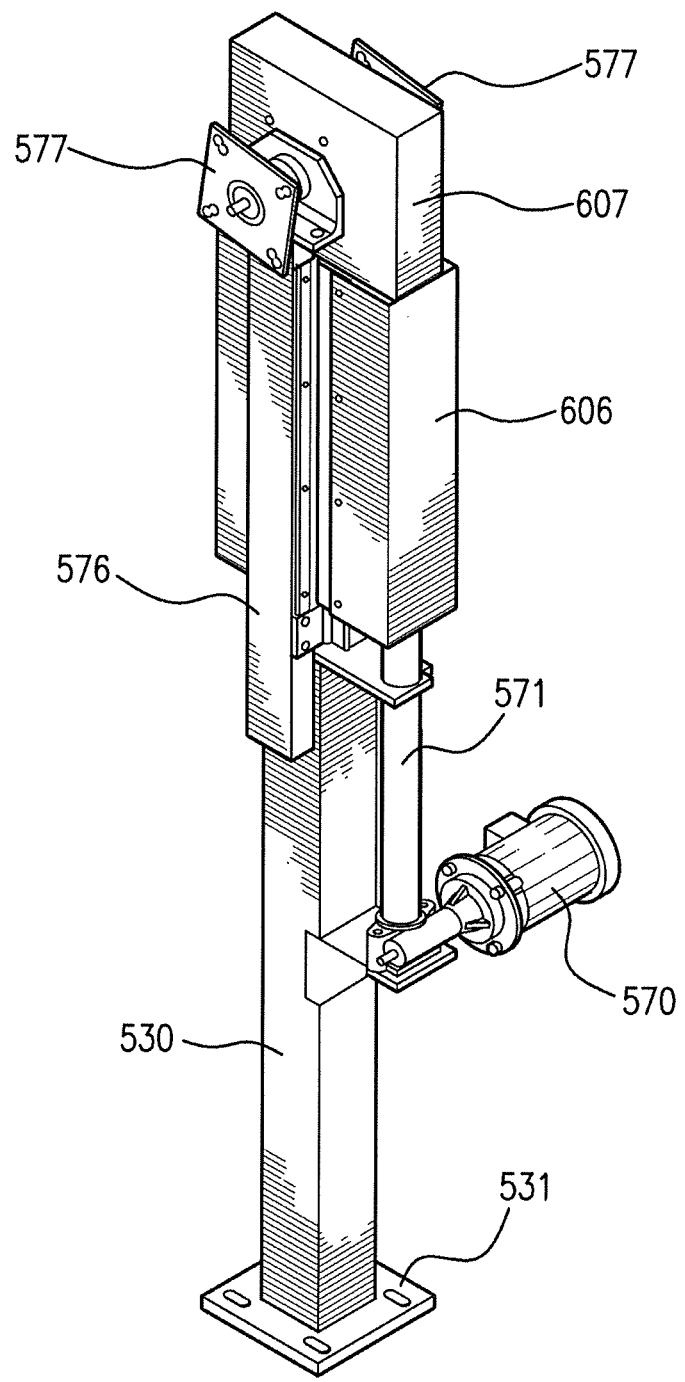

FIG. 23 is an enlarged exploded partial perspective view of the chain drive connected to a vertical support and a drive operatively connected to the chain drive according to the embodiment of FIG. 22. This enlarged view depicts the interior surface 609 of the cover 606 which engages the first and second rolling members 604 and 605, and a portion of the top cover 607.

In one embodiment, the drive chain functions as an anti-backlash mechanism connected to the longitudinal support to counteract a force acting on the longitudinal support caused by the distribution of mass of the plurality of solar cell modules after the longitudinal support is rotated by the drive beyond a predetermined rotational position.

In one embodiment, the drive chain is configured for the linear actuator to apply a constant torque on the longitudinal support during movement in the first rotational direction between a first rotational position at a beginning of a day and a second rotational position at an end of a day.

In one embodiment, a center of gravity of the array is positioned along the longitudinal support.

In one embodiment, the drive chain maintains a constant potential energy level of the array.

In one embodiment, the array further comprises a controller operatively connected to the drive and the string of linkages to control rotation of the longitudinal support about the first axis and the axial movement of the string of linkages.

U.S. Pat. No. 7,381,886 assigned to Emcore Corporation discloses solar cell arrays and positioning relative to the sun path and is herein incorporated by reference in its entirety.

In one embodiment, the terrestrial solar tracking array 100 can be installed in a straight-forward manner. The various components are sized to fit within a standard vehicle and are light-weight to allow installation by a single person or limited number of persons. Further, the modular aspect of the array 100 facilitates modifications after the initial installation. Additional sections 121 and vertical supports 130 may be added to the frame 110 to accommodate a desired number of additional solar cell modules 200. Further, the size of the array 100 may be reduced after installation by removing one or more solar cell modules 200. One or more dynamic drive chain mechanisms may be added to the array 100 as necessary. In one embodiment, additional mechanisms are added when the size of the array 100 is increased to accommodate additional solar cell modules 200.

While particular embodiments of the present invention have been shown and described, it will be understood by those skilled in the art that, based upon the teachings herein, changes and modifications may be made without departing from this invention and its broader aspects and, therefore, the appended claims are to encompass within their scope all such changes and modifications as are within the scope of this invention. Furthermore, it is to be understood that the invention is solely defined by the appended claims.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," "comprise" and variations thereof, such as, "comprises" and "comprising" are to be construed in an open, inclusive sense, that is as "including, but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

What is claimed is:

1. A terrestrial solar tracking photovoltaic array comprising:
   a longitudinal support constructed from a plurality of discrete sections placed in an end-to-end configuration;
   a drive chain operatively connected to the longitudinal support to rotate the longitudinal support about a first axis in first and second rotational directions;
   a plurality of mounts connected to the longitudinal support and spaced apart along a length of the longitudinal support for securing the array to a mounting surface;
   a plurality of solar cell array modules coupled to the longitudinal support, each of said solar cell modules comprising a rectangular case with a plurality of lenses positioned over corresponding receivers;
   a string of linkages spaced apart from the longitudinal support and connecting together each of the plurality of mounts, each of the linkages including a discrete length;
   the longitudinal support being rotatable about the first axis by the drive chain to simultaneously move each of the solar cell modules to track the sun within a first plane during the course of a day; and
   the string of linkages being movable axially along the longitudinal support to rotate each of the plurality of mounts and the connected solar cell modules within second planes that are each orthogonal to the first plane to track the sun during the course of the day.

2. The terrestrial solar tracking photovoltaic array of claim 1, further comprising a linear actuator connected to the drive chain to move the drive chain and thereby rotate the longitudinal support by an axial angle in excess of 180°.

3. An array as defined in claim 2, wherein the linear actuator includes a movable shaft having first and second rolling members disposed on opposite sides thereof.

4. An array as defined in claim 2, wherein the linear actuator is attached to and supported on one of said mounts.

5. An array as defined in claim 4, wherein said one mount includes a first linear track engaging the first rolling member.

6. An array as defined in claim 5, wherein said one mount includes a second linear track engaging the second rolling member.

7. An array as defined in claim 6, wherein said first linear track is disposed on a first side of the first and second rolling members, and said second linear track is disposed on a second opposite side of the first and second rolling members.

8. An array as defined in claim 6, wherein said first and second linear tracks are parallel.

9. An array as defined in claim 4, further comprising a housing covering at least a portion of the linear actuator and mounted on said one mounted.

10. An array as defined in claim 9, wherein the interior surface of said housing forms a track for engaging the second rolling member.

11. The terrestrial solar tracking photovoltaic array of claim 2, wherein the drive chain is configured for the linear actuator to apply a constant torque on the longitudinal support during movement in the first rotational direction between a first rotational position at a beginning of a day and a second rotational position at an end of a day.

12. The terrestrial solar tracking photovoltaic array of claim 1, further comprising a frame pivotably connected to the longitudinal support for supporting four solar array modules.

13. The terrestrial solar tracking photovoltaic array of claim 1, wherein the drive chain functions as an anti-backlash mechanism connected to the longitudinal support to counteract a force acting on the longitudinal support caused by the distribution of mass of the plurality of solar cell modules after the longitudinal support is rotated by the drive beyond a predetermined rotational position.

14. The terrestrial solar tracking photovoltaic array of claim 1, wherein a center of gravity of the array is positioned along the longitudinal support.

15. The terrestrial solar tracking photovoltaic array of claim 1, wherein the drive chain maintains a constant potential energy level of the array.

16. The terrestrial solar tracking photovoltaic array of claim 1, further comprising a controller operatively connected to the drive and the string of linkages to control rotation of the longitudinal support about the first axis and the axial movement of the string of linkages.

17. The terrestrial solar tracking photovoltaic array of claim 1, wherein the longitudinal support is a pipe with a diameter of about 4 inches with a coaxial first circular sprocket gear for engaging the drive chain.

18. An array as defined in claim 17, further comprising a second circular sprocket gear mounted on the vertical support for engaging the drive chain.

19. An array as defined in claim 18, wherein said second circular sprocket gear has a smaller diameter than said first circular sprocket gear.

20. An array as defined in claim 17, further comprising a housing covering the first circular sprocket gear.

* * * * *